United States Patent
Nishimori et al.

(10) Patent No.: US 9,929,262 B2
(45) Date of Patent: Mar. 27, 2018

(54) 3-5 DEVICE WITH DOPED REGIONS AND METHOD OF FABRICATING

(71) Applicant: FUJITSU LIMITED, Kawasaki-shi, Kanagawa (JP)

(72) Inventors: Masato Nishimori, Atsugi (JP); Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/276,242

(22) Filed: Sep. 26, 2016

(65) Prior Publication Data

US 2017/0125565 A1  May 4, 2017

(30) Foreign Application Priority Data

Oct. 29, 2015 (JP) .................. 2015-213112

(51) Int. Cl.
*H01L 29/778* (2006.01)
*H01L 21/265* (2006.01)
(Continued)

(52) U.S. Cl.
CPC .... *H01L 29/7787* (2013.01); *H01L 21/26546* (2013.01); *H01L 23/66* (2013.01); *H01L 29/0843* (2013.01); *H01L 29/66462* (2013.01); *H01L 29/7786* (2013.01); *H03F 1/3247* (2013.01); *H03F 1/3252* (2013.01); *H03F 3/19* (2013.01); *H03F 3/21* (2013.01); *H03F 3/245* (2013.01); *H01L 29/2003* (2013.01); *H01L 29/41766* (2013.01); *H01L 2224/0603* (2013.01); *H01L 2224/48247* (2013.01); *H01L 2224/48257* (2013.01); *H01L 2224/4903* (2013.01); *H03F 2200/204* (2013.01); *H03F 2200/333* (2013.01)

(58) Field of Classification Search
CPC ............. H01L 29/7787; H01L 29/7783; H01L 29/7782; H01L 29/7786
See application file for complete search history.

(56) References Cited

U.S. PATENT DOCUMENTS

2014/0092637 A1*  4/2014  Minoura ............... H01L 29/408
                                                                363/17
2017/0117402 A1*  4/2017  Koyama ............. H01L 21/3245

FOREIGN PATENT DOCUMENTS

JP          2010-192716       9/2010
JP          2011-44455        3/2011

OTHER PUBLICATIONS

Adak, S. "Effect of AlN Spacer Layer thickness on device performance of AlInN/AlN/GaN MOSHEMT" ICCUBEA 2015 available in IEEE Xplore Jul. 16, 2015 pp. 902-905.*

* cited by examiner

*Primary Examiner* — Asok K Sarkar
*Assistant Examiner* — Grant Withers
(74) *Attorney, Agent, or Firm* — Fujitsu Patent Center

(57) ABSTRACT

A semiconductor device includes a carrier transit layer including a first region and second and third regions having a density of a donor impurity element higher than that of the first region, an $In_X Al_Y Ga_{(1-X-Y)}N$ ($0<X<1$, $0<Y<1$, $0<X+Y\leq 1$) carrier supply layer provided over the carrier transit layer and having a density of a donor impurity element lower than that of the second and third regions, a source electrode provided over the second region, a drain electrode provided over the third region, and a gate electrode provided over the carrier supply layer between the source electrode and the drain electrode.

17 Claims, 13 Drawing Sheets

(51) Int. Cl.
    *H01L 23/66*     (2006.01)
    *H01L 29/66*     (2006.01)
    *H03F 1/32*     (2006.01)
    *H03F 3/19*     (2006.01)
    *H03F 3/21*     (2006.01)
    *H01L 29/08*     (2006.01)
    *H03F 3/24*     (2006.01)
    *H01L 29/417*     (2006.01)
    *H01L 29/20*     (2006.01)

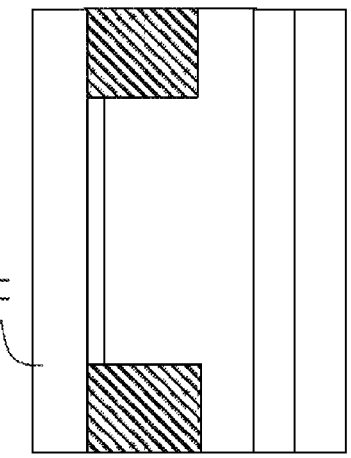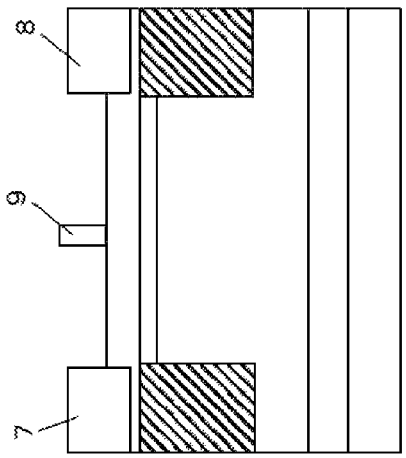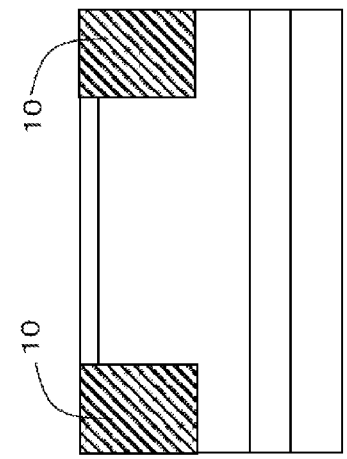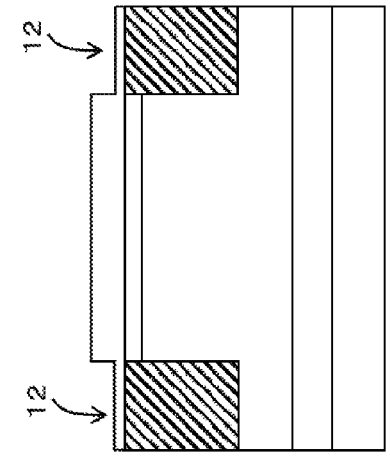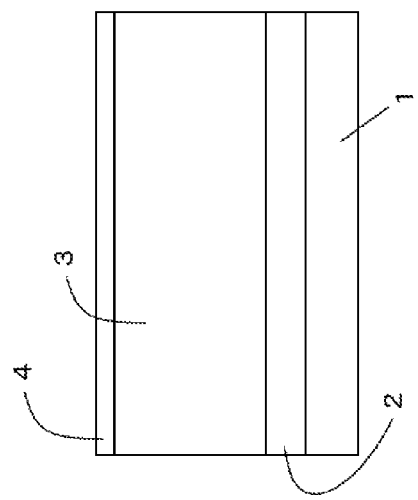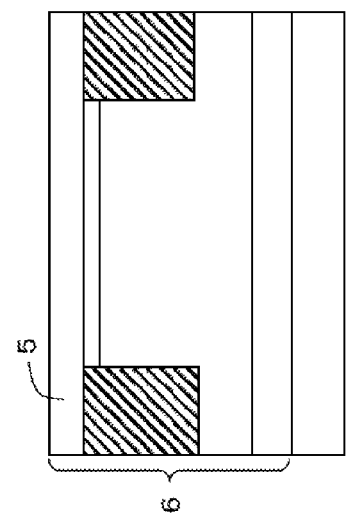

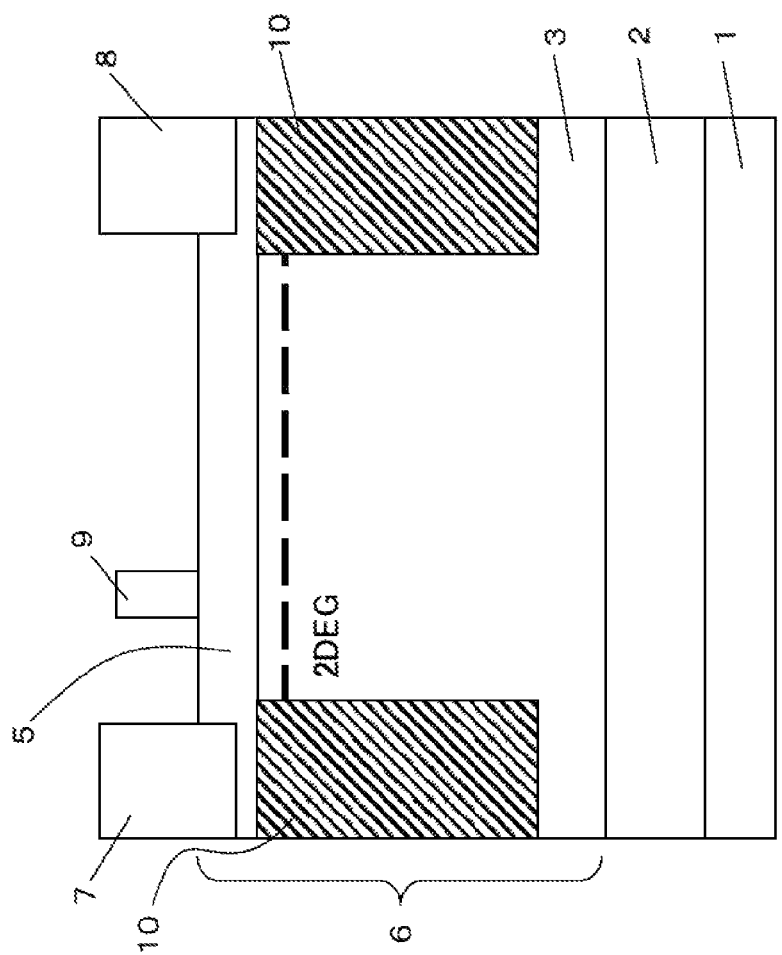

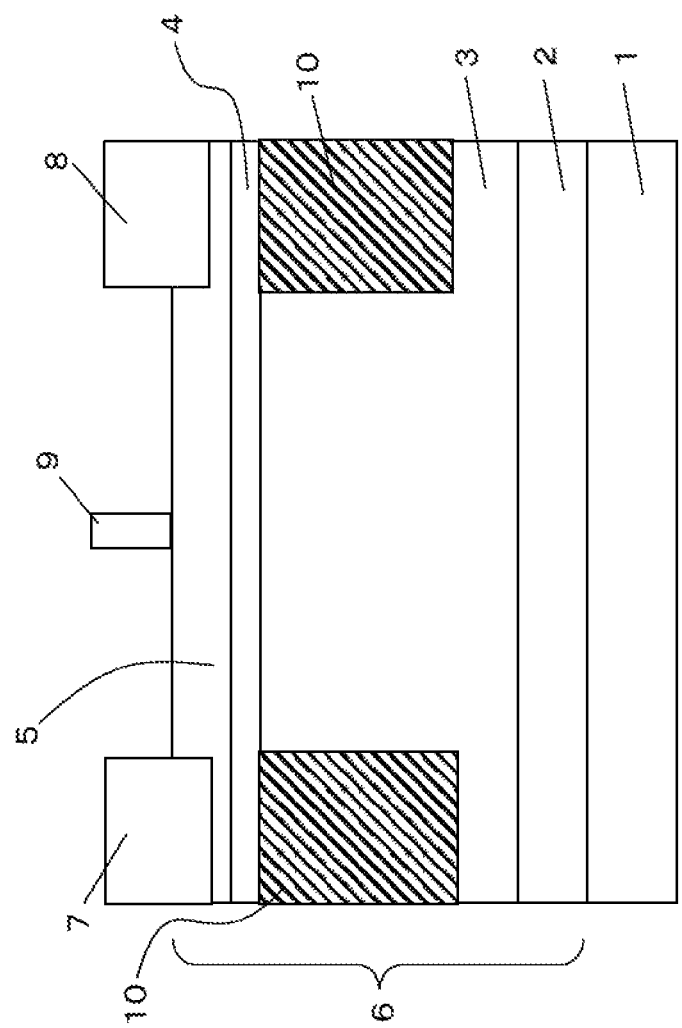

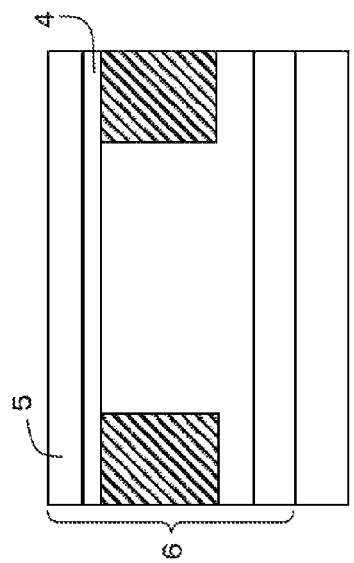
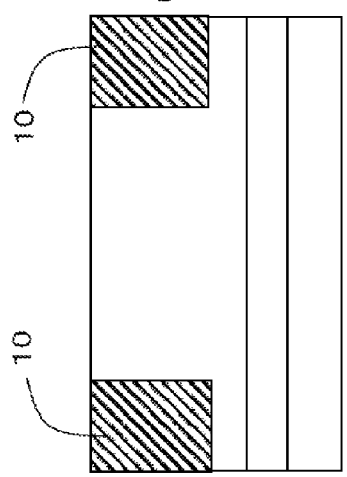
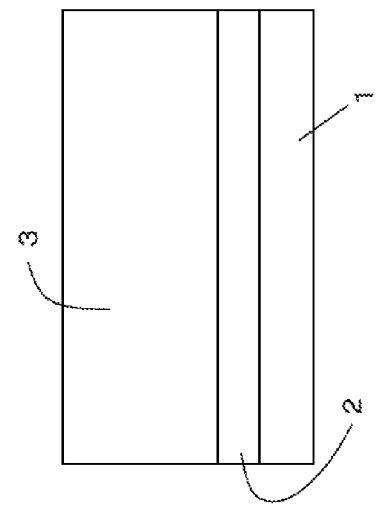
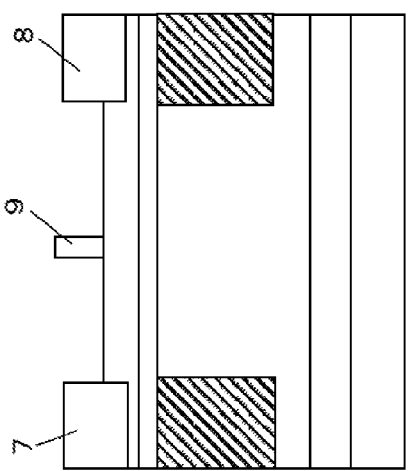
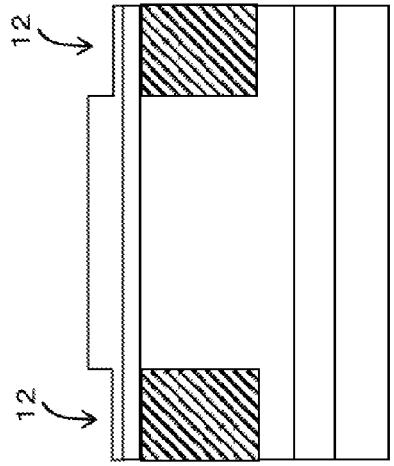

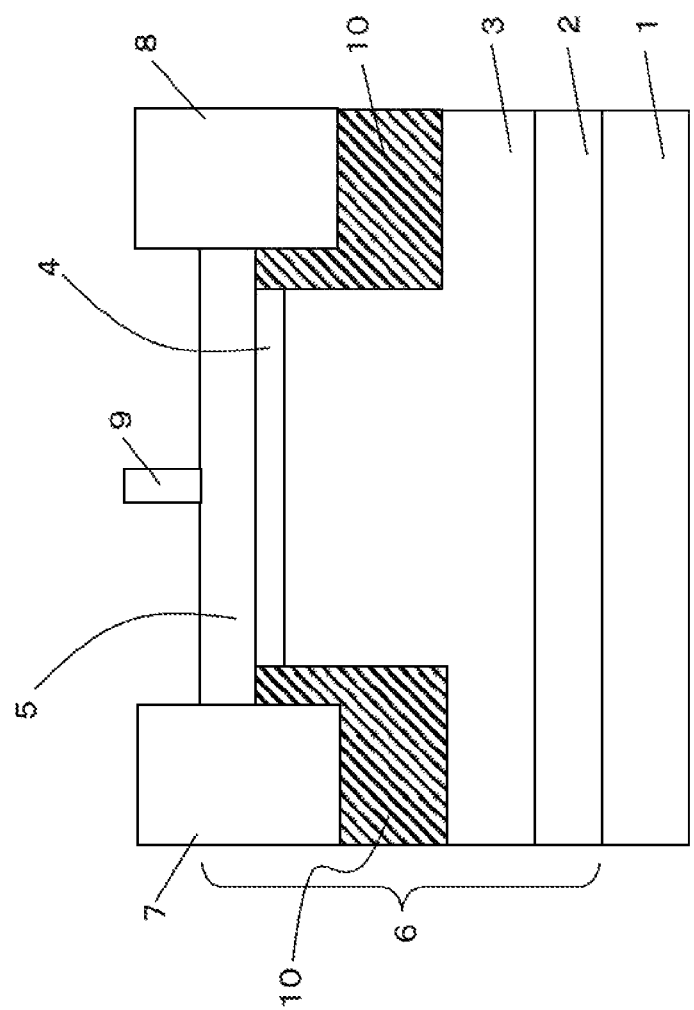

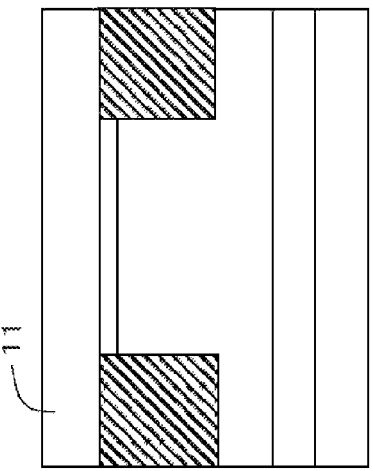
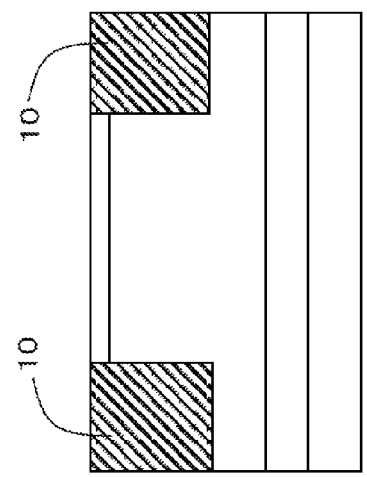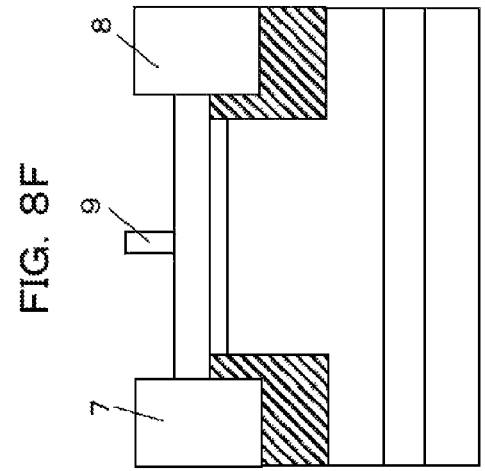
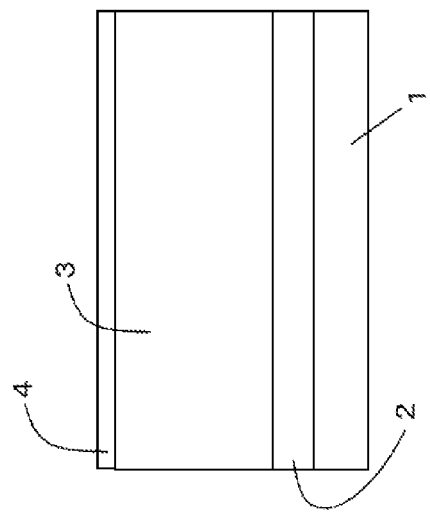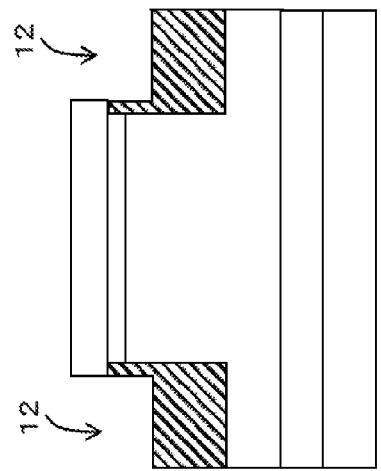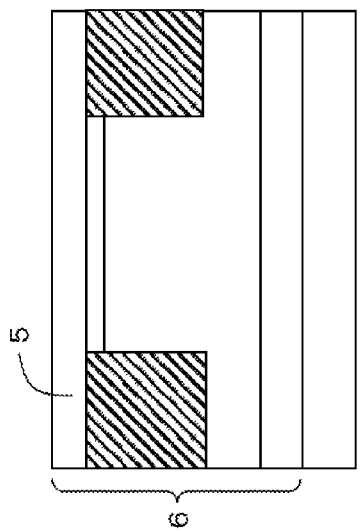

US 9,929,262 B2

3-5 DEVICE WITH DOPED REGIONS AND METHOD OF FABRICATING

CROSS-REFERENCE TO RELATED APPLICATION

This application is based upon and claims the benefit of priority of the prior Japanese Patent Application No. 2015-213112, filed on Oct. 29, 2015, the entire contents of which are incorporated herein by reference.

FIELD

The embodiments discussed herein are related to a semiconductor device and a fabrication method therefor, a power supply apparatus and a high-frequency amplifier.

BACKGROUND

Since GaN is a material having a wide band gap, a high breakdown field intensity and a high saturation electron speed, GaN is very promising as a material capable of implementing a device (semiconductor device) of great current, a high voltage and low on-resistance operation.

Therefore, development of a GaN-based HEMT (High Electron Mobility Transistor) in which GaN is used as an electron transit layer is being performed lively.

Conventionally, as a GaN-based HEMT (GaN-HEMT), development of an AlGaN/GaN-HEMT in which GaN and AlGaN are used for an electron transit layer and an electron supply layer, respectively, and an AlGaN/GaN heterojunction is utilized is being performed lively.

SUMMARY

According to an aspect of the embodiment, a semiconductor device includes a carrier transit layer including a first region and second and third regions having a density of a donor impurity element higher than that of the first region, an $In_XAl_YGa_{(1-X-Y)}N$ ($0<X<1$, $0<Y<1$, $0<X+Y\leq1$) carrier supply layer provided over the carrier transit layer and having a density of a donor impurity element lower than that of the second and third regions, a source electrode provided over the second region, a drain electrode provided over the third region, and a gate electrode provided over the carrier supply layer between the source electrode and the drain electrode.

According to an aspect of the embodiment, a power supply apparatus includes a transistor, wherein the transistor includes a carrier transit layer including a first region and second and third regions having a density of a donor impurity element higher than that of the first region, an $In_XAl_YGa_{(1-X-Y)}N$ ($0<X<1$, $0<Y<1$, $0<X+Y\leq1$) carrier supply layer provided over the carrier transit layer and having a density of a donor impurity element lower than that of the second and third regions, a source electrode provided over the second region, a drain electrode provided over the third region, and a gate electrode provided over the carrier supply layer between the source electrode and the drain electrode.

According to an aspect of the embodiment, a high-frequency amplifier includes an amplifier configured to amplify an input signal, wherein the amplifier includes a transistor, and the transistor includes a carrier transit layer including a first region and second and third regions having a density of a donor impurity element higher than that of the first region, an $In_XAl_YGa_{(1-X-Y)}N$ ($0<X<1$, $0<Y<1$, $0<X+Y\leq1$) carrier supply layer provided over the carrier transit layer and having a density of a donor impurity element lower than that of the second and third regions, a source electrode provided over the second region, a drain electrode provided over the third region, and a gate electrode provided over the carrier supply layer between the source electrode and the drain electrode.

According to an aspect of the embodiment, a fabrication method for a semiconductor device includes forming a carrier transit layer including a first region and second and third regions having a density of a donor impurity element higher than that of the first region, forming, over the carrier transit layer, an $In_XAl_YGa_{(1-X-Y)}N$ ($0<X<1$, $0<Y<1$, $0<X+Y\leq1$) carrier supply layer having a density of a donor impurity element lower than that of the second and third regions, forming a source electrode over the second region and forming a drain electrode over the third region, and forming a gate electrode over the carrier supply layer between the source electrode and the drain electrode.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF THE DRAWINGS

FIGS. 3A to 3F are schematic sectional views illustrating a fabrication method for the semiconductor device according to the first embodiment;

FIG. 4 is a schematic sectional view depicting a configuration of a semiconductor device according to modifications to the first embodiment;

FIG. 5 is a schematic sectional view depicting a configuration of a semiconductor device according to a first modification to the first embodiment;

FIGS. 6A to 6E are schematic sectional views illustrating a fabrication method for the semiconductor device according to the first modification to the first embodiment;

FIG. 7 is a schematic sectional view depicting a configuration of a semiconductor device according to a second modification to the first embodiment;

FIGS. 8A to 8F are schematic sectional views illustrating a fabrication method for the semiconductor device according to the second modification to the first embodiment;

DESCRIPTION OF EMBODIMENTS

Incidentally, in recent years, development of an InAlN/GaN-HEMT in which GaN and InAlN are used for an electron transit layer and an electron supply layer, respectively, is advanced in order to achieve a still higher efficiency.

In the InAlN/GaN-HEMT, since two-dimensional electron gas (2DEG: Dimensional electron gas) having a higher concentration than that of a conventional AlGaN/GaN-HEMT is obtained due to high spontaneous polarization of InAlN, the sheet carrier concentration can be raised. Therefore, reduction of the resistance of a device can be expected.

However, if InAlN is used, then the height of a Schottky barrier increases between the source electrode and the drain electrode that are ohmic electrodes. Therefore, it is difficult to obtain a good ohmic contact and implementation of reduction of the resistance of a device is difficult.

It is to be noted that, while a subject where an InAlN layer is used for an electron supply layer is described here, the subject is not limited to this and there is a similar subject also in the case where an $In_XAl_YGa_{(1-X-Y)}N$ (0<X<1, 0<Y<1, 0<X+Y≤1) layer is used for a carrier supply layer.

Therefore, it is demanded to implement reduction of the resistance of a semiconductor device where an $In_XAl_YGa_{(1-X-Y)}N$ (0<X<1, 0<Y<1, 0<X+Y≤1) layer is used for a carrier supply layer.

In the following, a semiconductor device and a fabrication method therefor, a power supply apparatus and a high-frequency amplifier according to embodiments of the present disclosure are described with reference to the drawings.

First Embodiment

First, a semiconductor device and a fabrication method therefor according to the first embodiment are described with reference to FIGS. 1 to 10E.

A semiconductor device according to the present embodiment is a compound semiconductor device in which a compound semiconductor such as, for example, a nitride semiconductor is used, and is a semiconductor device that has a nitride semiconductor stack structure (HEMT structure) including an electron transit layer and an electron supply layer. Such a semiconductor device as just described is used for a high-efficiency amplifier in the next generation to be used, for example, in abase station or the like, a high-efficiency switching device for controlling the electric power or the like.

Here, the present embodiment is described taking, as an example, an InAlN/GaN-HEMT in which GaN and InAlN are used for an electron transit layer (channel layer) and an electron supply layer, respectively.

Figure 1:
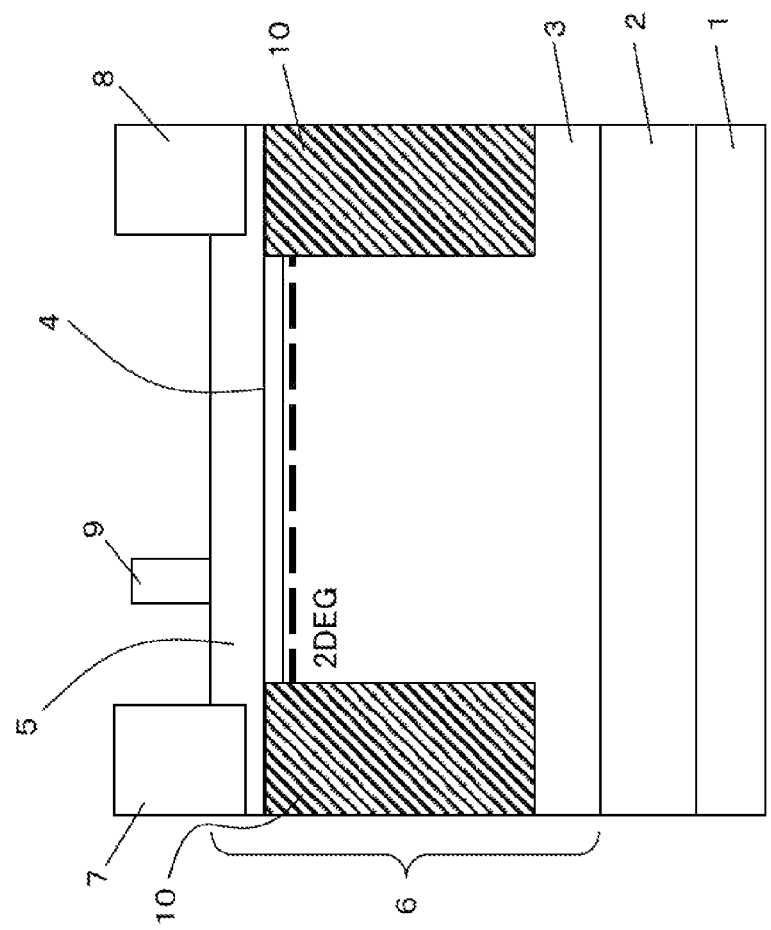
FIG. 1 is a schematic sectional view depicting a configuration of a semiconductor device according to a first embodiment.

For example, as depicted in FIG. 1, the present semiconductor device includes a substrate 1 and a semiconductor stack structure 6 that is provided over the substrate 1 and includes a GaN layer (GaN electron transit layer; GaN channel layer) 3 that is an electron transit layer and an InAlN layer (InAlN electron supply layer) 5 that is provided over the substrate 1.

In this case, as indicated by a broken line in FIG. 1, two-dimensional electron gas (2DEG) is generated in the proximity of the interface between the GaN electron transit layer 3 and the InAlN electron supply layer 5.

Here, the substrate 1 is, for example, an SiC substrate. It is to be noted that, as the substrate 1, an Si substrate, an SiC substrate, a sapphire substrate, a GaN substrate or the like can be used.

Further, in order to suppress alloy scattering and suppress increase of the sheet resistance, the present semiconductor device includes a spacer layer (here, AlN spacer layer) 4 between the electron transit layer 3 and the electron supply layer 5. In particular, the present semiconductor device includes the semiconductor stack structure 6 that in turn includes the GaN electron transit layer 3, AlN spacer layer 4 and InAlN electron supply layer 5 over the substrate 1. Here, the semiconductor device is structured such that a buffer layer 2, the GaN electron transit layer 3, the AlN spacer layer 4 and the InAlN electron supply layer 5 are stacked on the substrate 1. Here, the GaN layer 3 that is an electron transit layer, AlN layer 4 that is a spacer layer and InAlN layer 5 that is an electron supply layer are undoped semiconductor layers. It is to be noted that the spacer layer 4 may be an AlGaN layer.

Further, a source electrode 7, a drain electrode 8 and a gate electrode 9 are provided over the semiconductor stack structure 6.

Particularly, in the present embodiment, the semiconductor stack structure 6 includes a high-concentration impurity region 10 that is provided at portions under the source electrode 7 and the drain electrode 8 other than the InAlN electron supply layer 5 and has a concentration of an impurity element (donor impurity element), which serves as a donor, higher than that of any other portion.

Since, in the present embodiment, the semiconductor stack structure 6 includes the AlN spacer layer 4 between the GaN electron transit layer 3 and the InAlN electron supply layer 5 as described over, the high-concentration impurity region 10 is provided at each of portions of the GaN electron transit layer 3 and the AlN spacer layer 4 under the source electrode 7 and drain electrode 8. In particular, the high-concentration impurity regions 10 are provided on the GaN electron transit layer 3 and the AlN spacer layer 4 just under the source electrode 7 and the drain electrode 8 that are ohmic electrodes. It is to be noted that the high-concentration impurity region 10 is not provided on the InAlN electron supply layer 5 under the source electrode 7 and the drain electrode 8.

In this case, the semiconductor device includes the electron transit layer (carrier transit layer) 3 having a first region, and a second region (high-concentration impurity region 10) and a third region (high-concentration impurity region 10) each having a concentration of a donor impurity element higher than that of the first region, the electron supply layer (carrier supply layer) 5 of $In_XAl_YGa_{(1-X-Y)}N$ (0<X<1, 0<Y<1, 0<X+Y≤1) provided over the electron transit layer 3 and having a concentration of a donor impurity element lower than that of the second and third regions, the source electrode 7 provided over the second region, the drain electrode 8 provided over the third region and the gate electrode 9 provided over the electron supply layer 5 between the source electrode 7 and the drain electrode 8.

It is to be noted that the first region of the electron transit layer 3 is a region of the electron transit layer 3 other than the high-concentration impurity regions 10 (second and third regions) and has a concentration of a donor impurity element lower than that of the high-concentration impurity region 10. Here, the expression "concentration of a donor impurity element is low" is intended to include also a case where the concentration of a donor impurity element is zero, for example, an undoped semiconductor layer. Further, the electron supply layer 5 has a concentration of a donor impurity element lower than that of the high-concentration impurity region 10 (second and third regions) of the electron transit layer 3. Here, it the expression "concentration of a donor impurity element is low" is intended to include also a case where the concentration of a donor impurity element is zero, for example, an undoped semiconductor layer.

Here, the semiconductor device further includes the spacer layer 4 provided between the electron transit layer 3 and the electron supply layer 5 and having a first region, a second region (high-concentration impurity region 10) and a third region (high-concentration impurity region 10) each having a concentration of a donor impurity element higher than that of the first region. The source electrode 7 is provided over the second region of the electron transit layer 3 and the second region of the spacer layer 4, and the drain electrode 8 is provided over the third region of the electron transit layer 3 and the third region of the spacer layer 4.

It is to be noted that the first region of the spacer layer 4 is a region of the spacer layer 4 other than the high-concentration impurity regions 10 (second and third regions) and has a concentration of a donor impurity element lower than that of the high-concentration impurity regions 10. Here, the expression "concentration of a donor impurity element is low" is intended to include also a case where the concentration of a donor impurity element is zero, for example, an undoped semiconductor layer.

Incidentally, the donor impurity element here is Si. It is to be noted that the donor impurity element is not limited to this and may be any of Si, O, S, Ge, Te and Se.

Further, as hereinafter described, by performing ion implantation of Si into portions of the GaN electron transit layer 3 and AlN spacer layer 4 just under the source electrode 7 and drain electrode 8, the high-concentration Si regions (high-concentration impurity regions) 10 having a concentration of Si higher than that of the other portion of the layers 3 and 4 are provided. In particular, by performing ion implantation of Si into portions of the undoped GaN electron transit layer 3 and the undoped AlN spacer layer 4 just under the source electrode 7 and the drain electrode 8, the portions are configured as n-type semiconductor regions 10. It is to be noted that the high-concentration impurity region 10 is referred to sometimes as n-type impurity region, n-type impurity implanted region, n-type impurity doped region, n-type semiconductor region, high-concentration n-type region, n-type region or Si ion implantation region. Here, the doping concentration of Si is approximately $1\times10^{19}$ cm$^{-3}$. It is to be noted that the doping concentration of Si of the high-concentration Si regions 10 may be approximately $1\times10^{18}$ cm$^{-3}$ or more but approximately $1\times10^{21}$ cm$^{-3}$ or less. This is because a concentration of approximately $1\times10^{18}$ cm$^{-3}$ or more is a high concentration and, if the doping concentration is equal to or higher than approximately $1\times10^{21}$ cm$^{-3}$, then the crystallinity is improved.

Since such high-concentration impurity regions 10 as described above are provided, reduction of the resistance of a device, namely, reduction of the on resistance, can be implemented. In particular, since the high-concentration impurity regions 10 are provided over the GaN electron transit layer 3, carriers are supplied from a donor in the high-concentration impurity regions 10, and fixed carriers can be generated irrespective of the thickness of the InAlN electron supply layer 5 and reduction of the resistance of a device can be implemented.

Further, in the present embodiment, the InAlN electron supply layer 5 is provided in an overall area including portions under the source electrode 7 and the drain electrode 8, and the thickness of the portions under the source electrode 7 and the drain electrode 8 is reduced from that of the other portion. In this case, it is preferable to set, in the InAlN electron supply layer 5, the thickness of the portions under the source electrode 7 and the drain electrode 8 to approximately 3 nm or less. By reducing the thickness of the InAlN electron supply layer just under the source electrode 7 and the drain electrode 8 that are ohmic electrodes in this manner, tunnel current can be increased and the contact resistance can be reduced.

In this case, the electron supply layer 5 includes a first region provided over the first region of the electron transit layer 3, a second region provided between the second region (high-concentration impurity region 10) of the electron transit layer 3 and the source electrode 7 and a third region provided between the third region (high-concentration impurity region 10) of the electron transit layer 3 and the drain electrode 8. The thickness of the second and third regions of the electron supply layer 5 is smaller than that of the first region of the electron supply layer 5. Further, it is preferable to set the thickness of the second and third regions of the electron supply layer 5 to 3 nm or less.

Also where the thickness of the InAlN electron supply layer 5 just under the source electrode 7 and the drain electrode 8 that are ohmic electrodes is decreased to reduce contact resistance, since such high-concentration impurity regions 10 as described above are provided, the sheet resistance can be suppressed from increasing and reduction of the resistance of a device can be implemented. In particular, even where the thickness of the InAlN electron supply layer 5 just under the source electrode 7 and the drain electrode 8 is decreased to reduce contact resistance, since the high-concentration impurity regions 10 are provided on the GaN electron transit layer 3 just under the source electrode 7 and the drain electrode 8 such that carriers are supplied from a donor of the high-concentration impurity regions 10, the sheet resistance can be suppressed from increasing just under the source electrode 7 and the drain electrode 8 and reduction of the resistance of a device can be implemented.

Incidentally, the reason why such high-concentration impurity regions 10 as described above are provided is described below.

Since, in the InAlN/GaN-HEMT, a 2DEG having a higher concentration than that of a conventional AlGaN/GaN-HEMT is obtained due to high spontaneous polarization of InAlN, the sheet carrier concentration can be made high. Therefore, reduction of the resistance of a device can be expected.

However, if InAlN is used, then the height of a Schottky barrier increases between a source electrode and a drain electrode that are ohmic electrodes and the contact resistance increases. Therefore, it is difficult to obtain a good ohmic contact and it is difficult to implement reduction of the resistance of a device.

For example, it may seem recommendable to reduce, in order to reduce the contact resistance, the thickness of an InAlN electron supply layer under (just under) a source electrode and a drain electrode that are ohmic electrodes, for example, to approximately 3 nm or less to increase the tunnel current.

Figure 2:
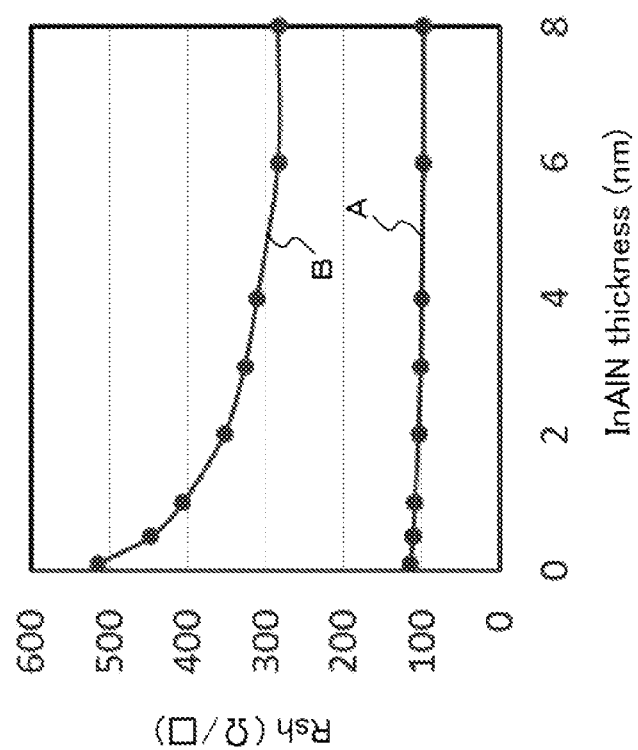
FIG. 2 is a view illustrating an advantageous effect by the semiconductor device according to the first embodiment.

However, if the thickness of the InAlN electron supply layer is decreased, then the sheet resistance (Rsh) at a location at which the thickness is reduced increases (refer to a solid line B in FIG. 2). In particular, even if the contact resistance is reduced by decreasing the thickness of the InAlN electron supply layer, since the sheet resistance at the location at which the ohmic electrodes are formed increases, reduction of the resistance of a device cannot be implemented after all.

It is to be noted that this similarly applies not only to the case where the thickness of the InAlN electron supply layer under the source electrode and the drain electrode is decreased but also to the case where the InAlN electron supply layer under the source electrode and the drain electrode is removed.

In this manner, reduction of the contact resistance and reduction of the sheet resistance have a tradeoff relationship therebetween.

Therefore, where an $In_XAl_YGa_{(1-X-Y)}N$ ($0<X<1$, $0<Y<1$, $0<X+Y\leq1$) layer is used for the electron supply layer 5, such high-concentration impurity regions 10 as described above are provided in order to implement reduction of the resistance of a device.

Especially, even where the thickness of the InAlN electron supply layer 5 is decreased, for example, to approximately 3 nm or less in order to reduce the contact resistance, by providing such high-concentration impurity regions 10 as described above, the sheet resistance (Rsh) can be suppressed from becoming high as indicated by a solid line A in FIG. 2. Therefore, the sheet resistance can be suppressed from increasing while the contact resistance is reduced, and reduction of the resistance of a device can be implemented. It is to be noted that, in FIG. 2, the thickness (InAlN thickness) of the InAlN layer that is an electron supply layer is equal to the thickness of a portion just under the source electrode and the drain electrode 8. Further, the doping concentration of Si in the Si ion implantation regions as the high-concentration impurity regions 10 is approximately $1\times10^{19}$ cm$^{-3}$.

Now, a fabrication method for the semiconductor device according to the present embodiment is described with reference to FIGS. 3A to 3F.

First, as depicted in FIG. 3A, an AlN layer as a buffer layer 2 is grown to a thickness, for example, of approximately 200 nm on an SiC substrate 1 as a growth substrate, for example, by a metal organic chemical vapor deposition (MOCVD) method.

Then, a GaN layer 3 as an electron transit layer is grown to a thickness, for example, of approximately 1 μm on the AlN buffer layer 2, for example, by an MOCVD method.

Then, an AlN layer 4 as a spacer layer is grown to a thickness, for example, of approximately 2 nm on the GaN electron transit layer 3, for example, by an MOCVD method.

Here, the AlN layer is formed by supplying trimethyl aluminum (TMAl) gas and ammonia (NH$_3$) gas into a growth chamber. Further, the GaN layer is formed by supplying trimethyl gallium (TMGa) gas and NH$_3$ gas into the growth chamber.

Then, as depicted in FIGS. 3B and 3C, at portions under (just under) regions (ohmic electrode forming regions) in which the source electrode 7 and the drain electrode 8 are to be formed other than the InAlN electron supply layer 5, high-concentration impurity regions 10 having a concentration of a donor impurity element higher than that of the other portion are formed.

In the present embodiment, the step of forming the high-concentration impurity regions 10 includes an ion implantation step of implanting ions of a donor impurity element into portions of the electron transit layer 3 and the spacer layer 4 under regions in which the source electrode 7 and drain electrode 8 are to be formed, and an activation annealing step of activating the ions of the ion-implanted donor impurity element.

Here, by implanting ions of Si into the undoped AlN spacer layer 4 and the undoped GaN electron transit layer 3 just under the regions in which the source electrode 7 and the drain electrode 8 are to be formed, the Si ion implantation regions (high-concentration impurity regions; n-type regions) 10 having a concentration of Si higher than that of the other portion are formed.

In particular, first, a wafer is extracted from the growth chamber and a resist pattern is formed, for example, from photoresist. Then, as depicted in FIG. 3B, ions of Si that serves as a donor impurity are implanted into part of the AlN spacer layer 4 and the GaN electron transit layer 3 just under the regions in which the source electrode 7 and drain electrode 8 that are ohmic electrodes are to be formed. Here, the acceleration energy of Si ions is, for example, approximately 20 keV, and the dose amount is, for example, approximately $1\times10^{13}$/cm$^2$.

Then, as depicted in FIG. 3C, an SiN film 11 as a protective film is formed to a thickness of approximately 200 nm for example, by the CVD method, and, as activation annealing for activating the ion-implanted Si ions, heat treatment is performed by approximately 1100° C., for example, for approximately 2 minutes within a nitrogen atmosphere.

In this manner, at part of the AlN spacer layer 4 and the GaN electron transit layer 3 which are portions under the regions in which the source electrode 7 and the drain electrode 8 are to be formed other than the InAlN electron supply layer 5, the Si ion implantation regions 10 having a concentration of Si that is a donor impurity element higher than that of the other portion are formed. In this manner, in the present embodiment, the step of forming the high-concentration impurity regions 10 includes an ion implantation step of performing ion implantation of a donor impurity element into portions of the electron transit layer 3 under the regions in which the source electrode 7 and drain electrode 8 are to be formed and an activation annealing step of activating the ions of the ion-implanted donor impurity element.

By forming such high-concentration impurity regions 10 as described above, reduction of the resistance of a device, namely, reduction of the on-resistance, can be implemented. In particular, by forming the high-concentration impurity regions 10 on the electron transit layer 3, carriers are supplied from a donor of the high-concentration impurity regions 10 and fixed carriers can be generated irrespective of the thickness of the InAlN electron supply layer 5, and reduction of the resistance of a device can be implemented.

Thereafter, the SiN film 11 is removed by an acid process using, for example, hydrofluoric acid or the like, and then an InAlN layer 5 as an electron supply layer is grown to a thickness, for example, of approximately 10 nm, for example, by an MOCVD method.

Here, the InAlN layer is formed by supplying TMAl gas, trimethyl indium (TMIn) gas and NH$_3$ gas into the growth chamber.

In this manner, since, in the present embodiment, activation annealing for activating ions of the ion-implanted donor impurity element is performed before the InAlN layer 5 as an electron supply layer is grown, also where an InAlN layer is used for the electron supply layer 5, the high-concentration impurity regions 10 can be formed without damaging the InAlN layer 5 by the activation annealing.

The reason why the configuration described above is applied is described below.

In particular, where an InAlN layer is used for the electron supply layer, if activation annealing is performed after growth of the InAlN layer, then the InAlN layer is damaged by the activation annealing. Therefore, it is difficult to form a high-concentration impurity region without damaging the InAlN layer.

For example, where ion implantation of Si as a donor impurity element is performed, activation annealing for activating Si ions is performed at approximately 1100° C. In this case, in the InAlN layer, In is desorbed at approximately 900° C. and the InAlN layer is damaged. Therefore, where an InAlN layer is used for the electron supply layer, it is difficult to apply an Si ion implantation technology to form a high-concentration impurity region.

In contrast, where an AlGaN layer is used for the electron supply layer, the AlGaN layer is not damaged by activation annealing, and therefore, a high-concentration impurity region can be formed by applying the Si ion implantation technology. In particular, where an AlGaN layer is used for the electron supply layer, after growth to the AlGaN layer, ion implantation of Si is performed into a portion including the AlGaN layer under the regions in which the source electrode and the drain electrode are to be formed, and then activation annealing is performed. A high-concentration impurity region can be formed thereby.

However, where an InAlN layer is used for the electron supply layer, if it is tried to form a high-concentration impurity region by a method similar to that where an AlGaN layer is used for the electron supply layer, then the InAlN layer is damaged by the activation annealing. Therefore, it is difficult to form a high-concentration impurity region without damaging the InAlN layer.

Therefore, as described above, activation annealing for activating ions of the ion-implanted donor impurity element is performed before the InAlN layer 5 as an electron supply layer is grown. Consequently, also where an InAlN layer is used for the electron supply layer 5, the high-concentration impurity regions 10 can be formed without damaging the InAlN layer 5 by the activation annealing. For example, where an InAlN layer is used for the electron supply layer 5, the high-concentration impurity regions 10 can be formed by applying the Si ion implantation technology.

It is to be noted that, while the present embodiment is described here taking, as an example, the case where the layers are formed epitaxially using an MOCVD method as a crystal growth method, the crystal growth method is not limited to this and also it is possible to use a different crystal growth method such as, for example, a molecular beam epitaxy (MBE) method.

In this manner, a semiconductor stack structure 6 structured such that the AlN buffer layer 2, GaN electron transit layer 3, AlN spacer layer 4 and InAlN electron supply layer 5 are stacked on the SiC substrate 1 and including the high-concentration impurity regions 10 is formed.

In this manner, in the present embodiment, the fabrication method includes the step of forming the semiconductor stack structure 6 including the GaN layer that is the electron transit layer 3 and the InAlN layer that is the electron supply layer 5 over the substrate 1. Further, the step of forming the semiconductor stack structure 6 includes the step of forming the electron transit layer 3, step of forming, at portions under the regions in which the source electrode 7 and the drain electrode 8 are to be formed other than the electron supply layers, the high-concentration impurity regions 10 having a concentration of a donor impurity element higher than that of the other portion and step of forming the electron supply layer 5. Further, the semiconductor stack structure 6 includes the spacer layer 4 between the electron transit layer 3 and the electron supply layer 5, and the step of forming the semiconductor stack structure 6 includes the step of forming the spacer layer 4. further, the step of forming the high-concentration impurity region 10 includes the ion implantation step of performing ion implantation of a donor impurity element into portions of the electron transit layer 3 and the spacer layer 4 under the regions in which the source electrode 7 and the drain electrode 8 are to be formed, and the activation annealing step of activating ions of the ion-implanted donor impurity element. Further, the step of forming the electron supply layer 5 is performed after the activation annealing step.

In short, the fabrication method for a semiconductor device according to the present embodiment includes the step of forming the electron transit layer (carrier transit layer) 3 having the first region and the second region (high-concentration impurity region 10) and third region (high-concentration impurity region 10) that have a concentration of a donor impurity element higher than that of the first region, and the step of forming the $In_XAl_YGa_{(1-X-Y)}N$ ($0<X<1$, $0<Y<1$, $0<X+Y\leq 1$) electron supply layer (carrier supply layer) 5 having a concentration of a donor impurity element lower than that of the second and third regions over the electron transit layer. Further, before the step of forming the electron supply layer 5, the fabrication method includes the step of forming the spacer layer 4 having the first region and the second region (high-concentration impurity region 10) and third region (high-concentration impurity region 10) that have a concentration of a donor impurity element higher than that of the first region over the electron transit layer 3. The step of forming the electron transit layer 3 and the step of forming the spacer layer 4 include the ion implantation step of performing ion implantation of a donor impurity element into the second and third regions of the electron transit layer 3 and the second and third regions of the spacer layer 4, and the activation annealing step of activating the ions of the ion-implanted donor impurity element.

Then, as depicted in FIG. 3E, a recess structure 12 is formed in the regions in which the source electrode 7 and the drain electrode 8 that are ohmic electrodes are to be formed.

In the present embodiment, the recess structure 12 is formed by decreasing the thickness of the InAlN electron supply layer 5 under (just under) the regions in which the source electrode 7 and drain electrode 8 that are ohmic electrodes are to be formed.

Here, the InAlN electron supply layer 5 is provided at the overall area including the portions just under the regions in which the source electrode 7 and the drain electrode 8 are to be formed. Therefore, the recess structure 12 is formed in the regions in which the source electrode 7 and the drain electrode 8 are to be formed by performing dry etching such as, for example, reactive ion etching (RIE) to partly remove the InAlN electron supply layer 5 just under the regions in which the source electrode 7 and the drain electrode 8 are to be formed in the thicknesswise direction and to decrease the thickness of a portion of the InAlN electron supply layer 5 with respect to the thickness of the other portion (recess etching). Here, chlorine-based gas such as, for example, $Cl_2$ or $BCl_3$ may be used as etching gas for the dry etching such as, for example, RIE.

In this manner, in the present embodiment, the fabrication method includes the step of decreasing the thickness of portions of the electron supply layer 5 under the regions in which the source electrode 7 and the drain electrode 8 are to be formed with respect to the thickness of the other portion before the step of forming the source electrode 7 and the drain electrode 8 but after the step of forming the electron supply layer 5.

In particular, in the present embodiment, the fabrication method includes the step of decreasing the thickness of the portions of the electron supply layer 5 provided over the second region (high-concentration impurity region 10) and the third region (high-concentration impurity region 10) of the electron transit layer 3 with respect to the thickness of the other portion before the step of forming the source electrode 7 and the drain electrode 8 after the step of forming the electron supply layer (carrier supply layer) 5.

In this manner, the contact resistance can be reduced by decreasing the thickness of the portions of the InAlN electron supply layer 5 under the regions in which the source electrode 7 and the drain electrode 8 are to be formed with respect to the thickness of the other portion. Further, also where the contact resistance is reduced by decreasing the thickness of the InAlN electron supply layer 5 as just described, since such high-concentration impurity regions 10 as described above are provided, increase of the sheet resistance can be suppressed and reduction of the resistance of a device can be implemented.

Especially, in order to facilitate flow of tunnel current, it is preferable to set the thickness of the InAlN electron supply layer 5, which is to remain just under the regions in which the source electrode 7 and the drain electrode 8 are to be formed by forming the recess structure 12, to approximately 3 nm or less. In particular, it is preferable to decrease the thickness of the InAlN electron supply layer 5 under the regions in which the source electrode 7 and the drain electrode 8 are to be formed (namely, the portions of the electron supply layer 5 provided over the high-concentration impurity regions 10 of the electron transit layer 3) to approximately 3 nm or less. Consequently, tunnel current can be increased with certainty and the contact resistance can be reduced with certainty.

Finally, as depicted in FIG. 3F, the source electrode 7, drain electrode 8 and gate electrode 9 are formed over the semiconductor stack structure 6.

In particular, the fabrication method for a semiconductor device according to the present embodiment includes the step of forming the source electrode 7 over the second region (high-concentration impurity region 10) and forming the drain electrode 8 over the third region (high-concentration impurity region 10), and the step of forming the gate electrode 9 over the electron supply layer 5 between the source electrode 7 and the drain electrode 8.

Here, as ohmic electrodes, the source electrode 7 and the drain electrode 8 configured, for example, from Ti/Al and the gate electrode 9 configured, for example, from Ni/Au are formed, for example, by vapor deposition/liftoff.

Here, the film thicknesses of a Ti film and an Al film configuring the source electrode 7 and the drain electrode 8 may be set, for example, to approximately 10 nm and approximately 200 nm, respectively, and the thicknesses of an Ni film and an Au film configuring the gate electrode 9 may be set, for example, to approximately 50 nm and approximately 300 nm, respectively.

Further, in order to reduce the contact resistance, it is preferable to perform heat treatment of approximately 600° C. for approximately 1 minute in a nitrogen atmosphere after the source electrode 7 and the drain electrode 8 that are ohmic electrodes are formed.

The semiconductor device according to the present embodiment can be fabricated as described above.

It is to be noted that, while the present embodiment is described taking, as an example, an InAlN/GaN-HEMT in which InAlN is used for an electron supply layer, the semiconductor device is not limited to this, and the present embodiment can be applied also to an InAlGaN/GaN-HEMT in which, for example, InAlGaN or the like is used for an electron supply layer. In particular, the present embodiment can be applied to an $In_XAl_YGa_{(1-X-Y)}N$ ($0<X<1$, $0<Y<1$, $0<X+Y\leq1$)/GaN-HEMT in which an $In_XAl_YGa_{(1-X-Y)}N$ ($0<X<1$, $0<Y<1$, $0<X+Y\leq1$) layer is used for an electron supply layer.

Accordingly, with the semiconductor device and the fabrication method therefor according to the present embodiment, there is an advantage that, where an $In_XAl_YGa_{(1-X-Y)}N$ ($0<X<1$, $0<Y<1$, $0<X+Y\leq1$) layer is used for the electron supply layer 5, reduction of the resistance of the semiconductor device can be implemented.

It is to be noted that, while, in the embodiment described above, the semiconductor stack structure 6 includes the spacer layer 4 provided between the electron transit layer 3 and the electron supply layer 5, the semiconductor stack structure 6 is not limited to this, and, for example, it may be configured to not include the spacer layer 4 as depicted in FIG. 4. In this case, the high-concentration impurity regions 10 may be provided at portions of the electron transit layer 3 under the source electrode 7 and the drain electrode 8. In this manner, the high-concentration impurity regions 10 may be provided at portions at least of the electron transit layer 3 under the source electrode 7 and the drain electrode 8. In particular, the semiconductor device may be configured so as to include the electron transit layer (carrier transit layer) 3 including the first region and the second region (high-concentration impurity region 10) and third region (high-concentration impurity region 10) both having a concentration of a donor impurity element higher than that of the first region, an $In_XAl_YGa_{(1-X-Y)}N$ ($0<X<1$, $0<Y<1$, $0<X+Y\leq1$) electron supply layer (carrier supply layer) 5 provided over the electron transit layer 3 and having a concentration of a donor impurity element lower than that of the second and third regions, the source electrode 7 provided over the second region, and the drain electrode 8 provided over the third region.

In this case, in the fabrication method for a semiconductor device, the step of forming the high-concentration impurity region 10 includes the ion implantation step of performing ion implantation of a donor impurity element into portions of the electron transit layer 3 under the regions in which the source electrode 7 and the drain electrode 8 are to be formed, and the activation annealing step of activating the ions of the ion-implanted donor impurity element, and the step of forming the electron supply layer 5 may be performed after the activation annealing step is performed. In particular, in the fabrication method for a semiconductor device, the step of forming the electron transit layer 3 may include the ion implantation step of performing ion implantation of a donor impurity element into the second region (high-concentration impurity region 10) and the third region (high-concentration impurity region 10), and the activation annealing step of activating the ions of the ion-implanted donor impurity element.

Further, while, in the embodiment described above, the semiconductor stack structure 6 includes the spacer layer 4 provided between the electron transit layer 3 and the electron supply layer 5 and the high-concentration impurity regions 10 are provided at the portions of the spacer layer 4 and the electron transit layer 3 under the source electrode 7 and the drain electrode 8, the semiconductor stack structure 6 is not limited to this.

(First Modification)

For example, as depicted in FIG. 5, the semiconductor stack structure 6 may include the spacer layer 4 provided between the electron transit layer 3 and the electron supply layer 5 and the high-concentration impurity regions 10 may be provided at portions of the electron supply layer 5 under the source electrode 7 and the drain electrode 8. In particular, the high-concentration impurity regions 10 may be provided on the electron transit layer 3 under the source electrode 7 and the drain electrode 8 but may not be provided on the spacer layer 4. In this manner, the semiconductor stack structure 6 may include the spacer layer 4 that is provided between the electron transit layer (carrier transit layer) 3 and the electron supply layer (carrier supply layer) 5 and has a concentration of a donor impurity element lower than that of the second region (high-concentration impurity region 10) and the third region (high-concentration impurity region 10). It is to be noted that, in this case, the spacer layer 4 has a concentration of a donor impurity element lower than that of the high-concentration impurity regions 10 (second and third regions) of the electron transit layer 3. Here, that "the concentration of a donor impurity element is lower than that of the high-concentration impurity region 10" includes a case where the concentration of a donor impurity element is zero, for example, a case where an undoped semiconductor layer is provided. This is referred to as first modification.

In this case, the fabrication method for a semiconductor device may be configured in the following manner. In particular, the step of forming the semiconductor stack structure 6 includes the step of forming the spacer layer 4 and the ion implantation step of performing ion implantation of a donor impurity element into portions of the electron transit layer 3 under the regions in which the source electrode 7 and the drain electrode 8 are to be formed. After the ion implantation step is performed, the step of forming the spacer layer 4 is performed at a temperature at which the ions of the ion-implanted donor impurity element can be activated. Thereafter, the step of forming the electron supply layer is performed. Further, the step of forming the high-concentration impurity regions 10 includes the ion implantation step and the step of forming the spacer layer 4 at a temperature at which the ions of the ion-implanted donor impurity element can be activated. In short, the fabrication method for a semiconductor device may be configured in the following manner. In particular, the fabrication method for a semiconductor device includes the step of forming the spacer layer 4 over the electron transit layer (carrier transit layer) 3 before the step of forming the electron supply layer (carrier supply layer) 5, and the step of forming the electron transit layer 3 and the step of forming the spacer layer 4 include the ion implantation step of performing ion implantation of a donor impurity element into the second region (high-concentration impurity region 10) and the third region (high-concentration impurity region 10) of the electron transit layer 3 and the step of forming the spacer layer 4 at a temperature at which the ions of the ion-implanted donor impurity element can be activated.

Consequently, the activation annealing step of the embodiment described above can be omitted. In particular, since the ions of the ion-implanted donor impurity element can be activated at the step of forming the spacer layer 4, the activation annealing step need not be performed separately and the man-hours can be decreased.

The semiconductor device according to the first modification can be fabricated in the following manner.

First, as depicted in FIG. 6A, an AlN layer as the buffer layer 2 is grown to a thickness, for example, of approximately 200 nm on an SiC substrate 1 as a growth substrate, for example, by an MOCVD method similarly as in the embodiment described above.

Then, similarly as in the embodiment described above, a GaN layer 3 as an electron transit layer is grown to a thickness, for example, of approximately 1 μm on the AlN buffer layer 2, for example, by an MOCVD method.

Then, as depicted in FIG. 6B, ion implantation of a donor impurity element is performed into portions of the electron transit layer 3 under regions in which a source electrode 7 and a drain electrode 8 are to be formed (ion implantation step).

Here, by performing ion implantation of Si into the portions of the undoped GaN electron transit layer 3 just under the source electrode 7 and the drain electrode 8, Si ion implantation regions (high-concentration impurity regions; n-type regions) 10 having a concentration of Si higher than that of the other portion are formed.

In particular, a wafer is extracted from the inside of a growth chamber first and a resist pattern is formed, for example, using photoresist. Then, ion implantation of Si as a donor impurity is performed into part of the GaN electron transit layer 3 just under the regions in which the source electrode 7 and the drain electrode 8 that are ohmic electrodes are to be formed. Here, the acceleration energy of the Si ions is, for example, approximately 20 keV, and the dose amount is, for example, approximately $1 \times 10^{13}/cm^2$.

Then, as depicted in FIG. 6C, an AlN layer 4 as a spacer layer is grown to a thickness, for example, of approximately 2 nm on the GaN electron transit layer 3, for example, by an MOCVD method. Here, the temperature upon growth of the AlN layer 4 is approximately 1100° C. In short, the temperature upon growth of the AlN layer 4 is set to a temperature at which Si ions that are ions of the ion-implanted donor impurity element can be activated. In short, the step of forming the spacer layer 4 is performed at a temperature at which the Si ions that are ions of the ion-implanted donor impurity element can be activated. Therefore, at the step of forming the AlN spacer layer 4, activation annealing for activating the ion-implanted Si ions is performed at the same time.

In this manner, at part of the GaN electron transit layer 3 which are portions under the regions in which the source electrode 7 and the drain electrode 8 are to be formed other than the electron supply layer 5, the Si ion implantation regions 10 having a concentration of Si, which is a donor impurity element, higher than that of the other portion is formed. In particular, at portions under (just under) the regions in which the source electrode 7 and the drain electrode 8 are to be formed (ohmic electrode formation presumption regions) other than the electron supply layer 5, the high-concentration impurity regions 10 having a concentration of a donor impurity element higher than that of the other portion are formed. In this manner, in the first modification, the step of forming the high-concentration impurity regions 10 includes the ion implantation step and the step of forming the spacer layer 4, which is performed at a temperature at which the ions of the ion-implanted donor impurity element can be activated.

By forming such high-concentration impurity regions 10 as just described, reduction of the resistance of a device, namely, reduction of the on-resistance, can be implemented. In particular, by forming the high-concentration impurity regions 10 on the electron transit layer 3, carriers are supplied from a donor of the high-concentration impurity region 10 and fixed carriers can be generated irrespective of the thickness of the electron supply layer 5, and reduction of the resistance of a device can be implemented.

Thereafter, similarly as in the embodiment described above, an InAlN layer 5 as an electron supply layer is grown to a thickness, for example, of approximately 10 nm on the AlN spacer layer 4, for example, by an MOCVD method.

In this manner, since, similarly as in the embodiment described above, activation annealing for activating ions of the ion-implanted donor impurity element is performed before the InAlN layer 5 as an electron supply layer is grown, also where an InAlN layer is used for the electron supply layer 5, the high-concentration impurity regions 10 can be formed without damaging the InAlN layer 5 by activation annealing.

In this manner, a semiconductor stack structure 6 structured such that the AlN buffer layer 2, GaN electron transit layer 3, AlN spacer layer 4 and InAlN electron supply layer 5 are stacked on the SiC substrate 1 and including the high-concentration impurity region 10 is formed.

In this manner, in the first modification, the fabrication method includes the step of forming the semiconductor stack structure 6 including the GaN layer 3 as the electron transit layer and the InAlN layer 5 as the electron supply layer over the substrate 1. Further, the step of forming the semiconductor stack structure 6 includes the step of forming the electron transit layer 3, the step of forming, at portions under the regions in which the source electrode 7 and the drain electrode 8 are to be formed other than the electron supply layer 5, the high-concentration impurity regions 10 having a concentration of a donor impurity element higher than that of the other portion, and the step of forming the electron supply layer 5. Further, the semiconductor stack structure 6 includes the spacer layer 4 provided between the electron transit layer 3 and the electron supply layer 5, and the step of forming the semiconductor stack structure 6 includes the step of forming the spacer layer 4 and the ion implantation step of performing ion implantation of a donor impurity element into the portions of the electron transit layer 3 under the regions in which the source electrode 7 and the drain electrode 8 are to be formed. Further, after the ion implantation step is performed, the step of forming the spacer layer 4 is performed at a temperature at which the ions of the ion-implanted donor impurity element can be activated, and then the step of forming the electron supply layer 5 is performed. Further, the step of forming the high-concentration impurity regions 10 includes the ion implantation step and the step of forming the spacer layer 4 at a temperature at which the ions of the ion-implanted donor impurity element can be activated.

In short, in the first modification, the fabrication method includes the step of forming the electron transit layer (carrier transit layer) 3 including the first region and the second region (high-concentration impurity region 10) and third region (high-concentration impurity region 10) individually having a concentration of a donor impurity element higher than that of the first region, and the step of forming the $In_XAl_YGa_{(1-X-Y)}N$ (0<X<1, 0<Y<1, 0<X+Y≤1) electron supply layer (carrier supply layer) 5 having a concentration of a donor impurity element lower than that of the second and third regions over the electron transit layer 3. Further, before the step of forming the electron supply layer (carrier supply layer) 5, the fabrication method includes the step of forming the spacer layer 4 over the electron transit layer (carrier transit layer) 3. Further, the step of forming the electron transit layer 3 and the step of forming the spacer layer 4 include the ion implantation step of performing ion implantation of a donor impurity element into the second region (high-concentration impurity region 10) and third region (high-concentration impurity region 10) of the electron transit layer 3, and the step of forming the spacer layer 4 at a temperature at which the ions of the ion-implanted donor impurity element can be activated.

Then, as depicted in FIG. 6D, a recess structure 12 is formed in the regions in which the source electrode 7 and the drain electrode 8 that are ohmic electrodes are to be formed similarly as in the embodiment described above.

In the first modification, the thickness of the InAlN electron supply layer 5 under (just under) the regions in which the source electrode 7 and the drain electrode 8 are to be formed is decreased to form the recess structure 12.

In this manner, in the first modification, the fabrication method includes, before the step of forming the source electrode 7 and the drain electrode 8 after the step of forming the electron supply layer 5, the step of decreasing the thickness of portions of the electron supply layer 5 under the regions in which the source electrode 7 and the drain electrode 8 are to be formed with respect to the thickness of the other portion.

In short, in the first modification, the fabrication method includes, before the step of forming the source electrode 7 and the drain electrode 8 but after the step of forming the electron supply layer (carrier supply layer) 5, the step of decreasing the thickness of portions of the electron supply layer 5 provided over the second region (high-concentration impurity region 10) and the third region (high-concentration impurity region 10) of the electron transit layer (carrier transit layer) 3 with respect to the thickness of the other portion.

In this manner, the contact resistance can be reduced by decreasing the thickness of portions of the InAlN electron supply layer 5 under the regions in which the source electrode 7 and the drain electrode 8 are to be formed with respect to the thickness of the other portion. Further, also where the thickness of the InAlN electron supply layer 5 is decreased to reduce the contact resistance in this manner, since such high-concentration impurity regions 10 as described above are provided, the sheet resistance can be suppressed from becoming high and reduction of the resistance of a device can be implemented.

Especially, in order to facilitate flow of tunnel current, it is preferable to set the thickness of the InAlN electron supply layer 5, which is to remain just under the regions in which the source electrode 7 and the drain electrode 8 are to be formed by forming the recess structure 12, to approximately 1 nm or less. In particular, it is preferable to decrease the thickness of the InAlN electron supply layer 5 under the regions in which the source electrode 7 and the drain electrode 8 are to be formed such that the thickness is decreased to approximately 1 nm or less. Consequently, the tunnel current can be increased with certainty and the contact resistance can be reduced with certainty.

Finally, as depicted in FIG. 6E, a source electrode 7, a drain electrode 8 and a gate electrode 9 are formed over the semiconductor stack structure 6 similarly as in the embodiment described above. In particular, the fabrication method for a semiconductor device according to the first modification includes the step of forming the source electrode 7 over the second region (high-concentration impurity region 10) and forming the drain electrode 8 over the third region (high-concentration impurity region 10), and the step of forming the gate electrode 9 over the electron supply layer 5 between the source electrode 7 and the drain electrode 8.

The semiconductor device according to the first modification can be fabricated in this manner.

Further, while, in the embodiment described above, the electron supply layer 5 is provided in the overall area including portions under the source electrode 7 and the drain electrode 8 and the thickness of the portions under the source electrode 7 and the drain electrode 8 is made smaller than that of the other portion, the electron supply layer 5 is not limited to this.

17

(Second Modification)

For example, as depicted in FIG. 7, portions of the electron supply layer 5 under the source electrode 7 and the drain electrode 8 may be removed such that the electron supply layer 5 does not exist under the source electrode 7 and the drain electrode 8. In short, the electron supply layer 5 may be provided at a portion other than portions under the source electrode 7 and the drain electrode 8. This is referred to as second modification.

In this case, the fabrication method for a semiconductor device may include, before the step of forming the source electrode 7 and the drain electrode 8 but after the step of forming the electron supply layer 5, a step of removing portions of the electron supply layer 5 under the regions in which the source electrode 7 and the drain electrode 8 are to be formed.

In this manner, while the fabrication method for a semiconductor device according to the embodiment described above includes, before the step of forming the source electrode 7 and the drain electrode 8 after the step of forming the electron supply layer 5, the step of decreasing the thickness of portions of the electron supply layer 5 under the regions in which the source electrode 7 and the drain electrode 8 are to be formed with respect to the thickness of the other portion, the fabrication method is not limited to this. For example, the fabrication method may include, before the step of forming the source electrode 7 and the drain electrode 8 after the step of forming the electron supply layer 5, the step of removing portions of the electron supply layer 5 under the regions in which the source electrode 7 and the drain electrode 8 are to be formed.

In this manner, the fabrication method for a semiconductor device includes, before the step of forming the source electrode 7 and the drain electrode 8 but after the step of forming the electron supply layer (carrier supply layer) 5, a step of removing portions of the electron supply layer 5 provided over the second region (high-concentration impurity region 10) and the third region (high-concentration impurity region 10) of the electron transit layer (carrier transit layer) 3. Further, the electron supply layer 5 is provided over the first region of the electron transit layer 3.

In the second modification, the source electrode and the drain electrode 8 contact each with the high-concentration impurity region (n-type region) 10. Here, since the high-concentration impurity regions 10 are n-type regions, the source electrode 7 and the drain electrode 8 directly contact each with the n-type region 10. Therefore, the contact resistance can be reduced further and further reduction of the resistance of a device can be implemented. Further, since the thickness of the electron supply layer 5 need not be controlled when the thickness of the electron supply layer 5 is decreased, simplification of the process and enhancement of the yield can be achieved.

The semiconductor device according to the second modification can be fabricated in the following manner.

First, as depicted in FIG. 8A, an AlN layer as the buffer layer 2, a GaN layer as the electron transit layer 3 and an AlN layer as the spacer layer 4 are grown on an SiC substrate 1 similarly as in the embodiment described above.

Then, as depicted in FIGS. 8B and 8C, at portions under (just under) the regions in which the source electrode 7 and the drain electrode 8 are to be formed (ohmic electrode forming region) other than the electron supply layer 5, high-concentration impurity regions (Si ion implantation regions) 10 having a concentration of a donor impurity element higher than that of the other portion are formed similarly as in the embodiment described above.

18

In particular, as depicted in FIG. 8B, ion implantation of Si as a donor impurity element is performed into part of the AlN spacer layer 4 and the GaN electron transit layer 3 just under the regions in which the source electrode 7 and the drain electrode 8 that are ohmic electrodes are to be formed.

Then, as depicted in FIG. 8C, an SiN film 11 as a protective film is grown to a thickness of approximately 200 nm, for example, by a CVD method, and, as activation annealing for activating the ion-implanted Si ions, heat treatment by approximately 1100° C. is performed in a nitrogen atmosphere for approximately 2 minutes.

Thereafter, as depicted in FIG. 8D, an InAlN layer 5 as an electron supply layer is grown similarly as in the embodiment described above.

In this manner, a semiconductor stack structure 6 structured such that the AlN buffer layer 2, GaN electron transit layer 3, AlN spacer layer 4 and InAlN electron supply layer 5 are stacked on the SiC substrate 1 and including the high-concentration impurity region 10 is formed.

Then, as depicted in FIG. 8E, a recess structure 12 is formed in the regions in which the source electrode 7 and the drain electrode 8 that are ohmic electrodes are to be formed.

In the second modification, the recess structure 12 is formed by removing the InAlN electron supply layer 5 under (just under) the regions in which the source electrode 7 and the drain electrode 8 are to be formed.

Here, the InAlN electron supply layer 5 is provided in the overall area including portions just under the regions in which the source electrode 7 and the drain electrode 8 are to be formed. Therefore, the recess structure 12 is formed in the regions in which the source electrode 7 and the drain electrode 8 are to be formed by performing dry etching such as, for example, reactive ion etching (RIE) (recess etching) to remove the InAlN electron supply layer 5 just under the regions in which the source electrode 7 and the drain electrode 8 are to be formed entirely in the thicknesswise direction. Here, chlorine-based gas such as, for example, $Cl_2$ or $BCl_3$ may be used as etching gas in the dry etching such as, for example, RIE.

In particular, the recess structure 12 is formed in the regions in which the source electrode 7 and the drain electrode 8 are to be formed by removing not only the InAlN electron supply layer 5 just under the regions in which the source electrode 7 and the drain electrode 8 are to be formed but also the GaN electron transit layer 3 on which the high-concentration impurity region 10 is formed to an intermediate portion.

In this manner, in the second modification, the fabrication method includes, after the step of forming the electron supply layer 5 but before the step of forming the source electrode 7 and the drain electrode 8, the step of removing portions of the electron supply layer 5 under the regions in which the source electrode 7 and the drain electrode 8 are to be formed. In short, in the second modification, the fabrication method includes, before the step of forming the source electrode 7 and the drain electrode 8 but after the step of forming the electron supply layer (carrier supply layer) 5, the step of removing portions of the electron supply layer 5 provided over the second region (high-concentration impurity region 10) and the third region (high-concentration impurity region 10) of the electron transit layer (carrier transit layer) 3.

In this manner, the contact resistance can be reduced by removing portions of the InAlN electron supply layer 5 under the regions in which the source electrode 7 and the drain electrode 8 are to be formed as described above.

Further, also where the contact resistance is reduced by removing the InAlN electron supply layer 5 in such a manner as described above, since such high-concentration impurity regions 10 as described above are provided, the sheet resistance can be suppressed from becoming high and reduction of the resistance of a device can be implemented.

Finally, as depicted in FIG. 8F, a source electrode 7, a drain electrode 8 and a gate electrode 9 are formed over the semiconductor stack structure 6 similarly as in the embodiment described above.

The semiconductor device according to the second modification can be fabricated in such a manner as described above.

It is to be noted that, while the second modification is described as a modification to the embodiment described above, the present modification can be applied also to the first modification described above. In particular, in the first modification, the recess structure 12 may be formed by removing the InAlN electron supply layer 5 under the regions in which the source electrode 7 and the drain electrode 8 that are ohmic electrodes are to be formed (for example, by removing portions from the InAlN electron supply layer 5 to an intermediate portion of the GaN electron transit layer 3) similarly as in the second modification.

(Third Modification)

Figure 9:
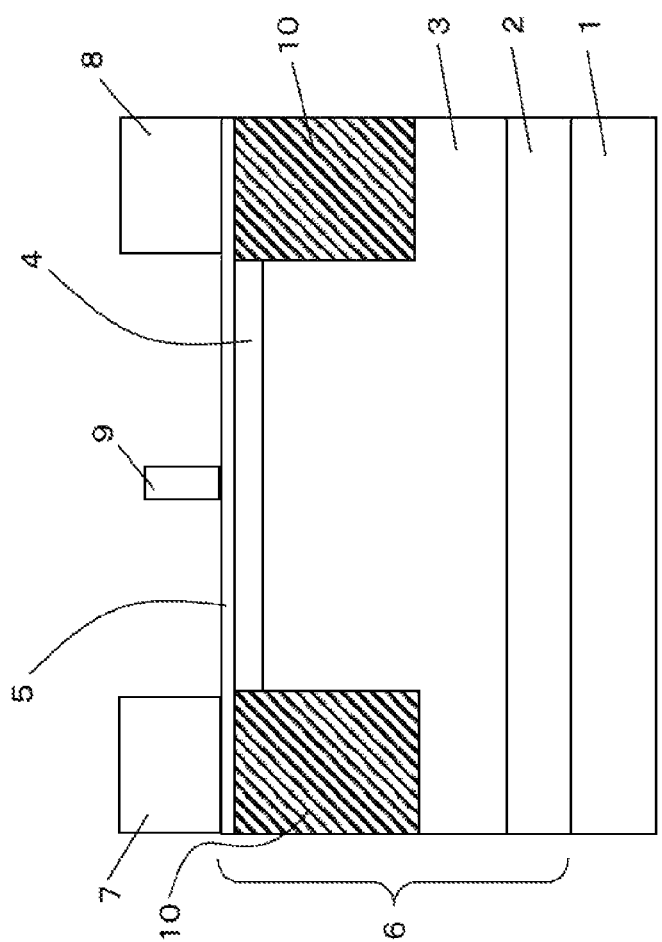
FIG. 9 is a schematic sectional view depicting a configuration of a semiconductor device according to a third modification to the first embodiment.

Further, the thickness of the electron supply layer 5 in the overall area may be decreased, for example, as depicted in FIG. 9. In particular, the electron supply layer 5 may be provided in the overall area including portions under the source electrode 7 and the drain electrode 8 and the thickness of the electron supply layer 5 in the overall area may be set to approximately 3 nm or less. In this case, the electron supply layer (carrier supply layer) 5 may include a first region provided over the first region of the electron transit layer (carrier transit layer) 3, a second region provided between the second region (high-concentration impurity region 10) of the electron transit layer 3 and the source electrode 7, and a third region provided between the third region (high-concentration impurity region 10) of the electron transit layer 3 and the drain electrode 8, and the thickness of the electro supply layer 5 in the first, second and third regions may be set to 3 nm or less. This is referred to as third modification.

In this case, at the step of forming the electron supply layer 5 in the fabrication method for a semiconductor device, the electron supply layer 5 having a thickness of approximately 3 nm or less may be formed in the overall area including portions under the regions in which the source electrode 7 and the drain electrode 8 are to be formed. In particular, at the step of forming the electron supply layer 5 in the fabrication method for a semiconductor device, the electron supply layer 5 having a thickness of 3 nm or less may be formed over the first region, second region (high-concentration impurity region 10) and third region (high-concentration impurity region 10) of the electron transit layer 3.

Consequently, the step of decreasing the thickness of the electron supply layer 5 under the regions in which the source electrode 7 and the drain electrode 8 that are ohmic electrodes are to be formed or the step of removing the electron supply layer 5 (for example, recess etching) may not be provided, and the number of processes can be decreased thereby.

For example, where the thickness of the InAlN electron supply layer 5 in the overall area is set to approximately 3 nm or less such that the thickness of the InAlN electron supply layer 5 just under the gate electrode 9 is decreased in order to improve the high-frequency characteristic, the thickness of the InAlN electron supply layer 5 under the source electrode 7 and the drain electrode 8 is sufficiently small even if recess etching as in the embodiment and modifications described above is not performed. Therefore, the contact resistance can be reduced, and, by providing the high-concentration impurity regions 10 further, the sheet resistance can be suppressed from becoming high and reduction of the resistance of a device can be implemented.

The semiconductor device according to the third modification can be fabricated in the following manner.

Figure 10C:
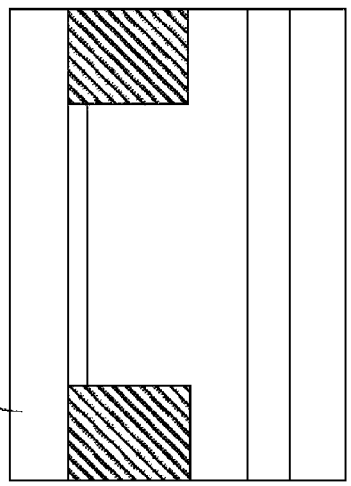
FIGS. 10A to 10E are schematic sectional views illustrating a fabrication method for the semiconductor device according to the third modification to the first embodiment.
Figure 10B:
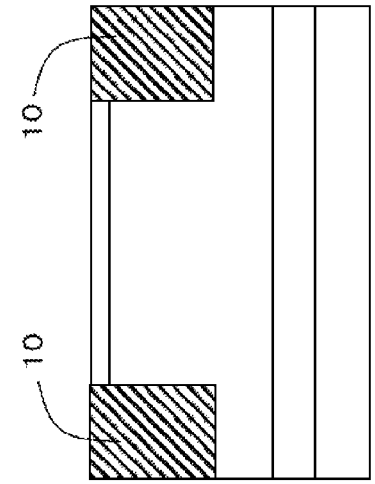
Figure 10A:
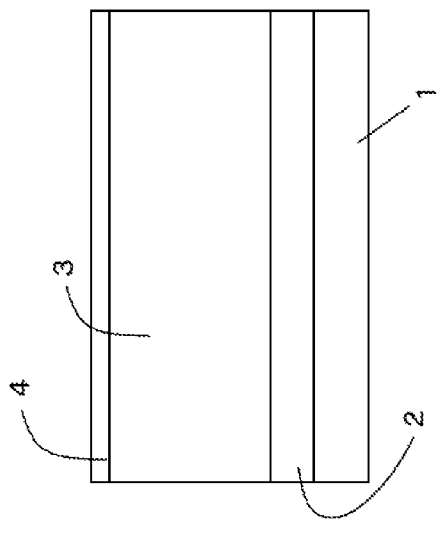

First, as depicted in FIG. 10A, an AlN layer as the buffer layer 2, a GaN layer as the electron transit layer 3 and an AlN layer as the spacer layer 4 are grown on an SiC substrate 1 similarly as in the embodiment described above.

Then, as depicted in FIGS. 10B and 10C, at portions under (just under) the regions in which the source electrode 7 and the drain electrode 8 are to be formed (ohmic electrode formation presumption regions) other than the electron supply layer 5, a high-concentration impurity region (Si ion implantation region) 10 having a concentration of a donor impurity element higher than that of the other portion is formed similarly as in the embodiment described above.

In particular, as depicted in FIG. 10B, ion implantation of Si as a donor impurity element is performed into part of the AlN spacer layer 4 and the GaN electron transit layer 3 just under the regions in which the source electrode 7 and the drain electrode 8 that are ohmic electrodes are to be formed.

Then, as depicted in FIG. 10C, an SiN film 11 as a protective film is grown to a thickness of approximately 200 nm, for example, by a CVD method, and heat treatment at approximately 1100° C., for example, in a nitrogen atmosphere is performed as activation annealing for activating the ion-implanted Si ions for approximately 2 minutes.

Figure 10E:
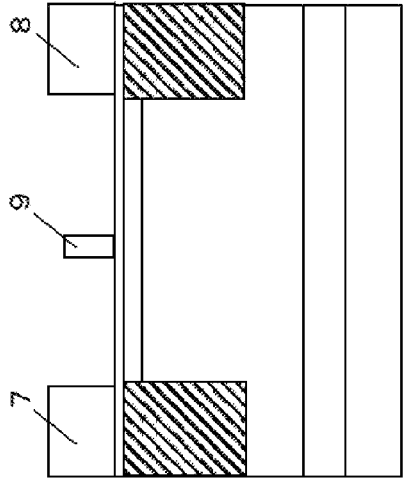
Figure 10D:
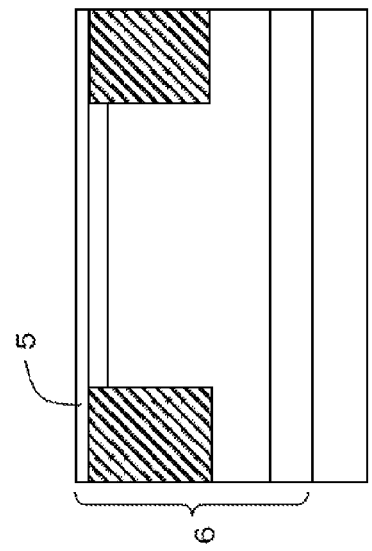

Thereafter, as depicted in FIG. 10D, an InAlN layer 5 as an electron supply layer is grown to approximately 2 nm. In particular, the InAlN electron supply layer 5 having a thickness of approximately 2 nm is formed in the overall area including portions under the regions in which the source electrode 7 and the drain electrode 8 are to be formed.

A semiconductor stack structure 6 structured such that the AlN buffer layer 2, GaN electron transit layer 3, AlN spacer layer 4 and InAlN electron supply layer 5 are stacked on the SiC substrate 1 and including the high-concentration impurity region 10 is formed as described above.

Finally, as depicted in FIG. 10E, a source electrode 7, a drain electrode 8 and a gate electrode 9 are formed over the semiconductor stack structure 6 similarly as in the embodiment described above.

The semiconductor device according to the third modification can be fabricated as described above.

It is to be noted that, while the third modification is described as a modification to the embodiment described above, the present modification can be applied also to the first modification and the second modification described above. In particular, in the first modification described above, the electron supply layer 5 may be provided in the overall area including portions under the source electrode 7 and the drain electrode 8 and the thickness of the electron supply layer 5 in the overall region may be set to approximately 3 nm or less similarly to the third modification. Further, in the fabrication method of the third modification, similarly as in the second modification described above, the recess structure 12 may be formed by removing the InAlN electron supply layer 5 under the regions in which the source electrode 7 and the drain electrode 8 that are ohmic electrodes are to be formed (for example, by removing portions from the InAlN electron supply layer 5 to an intermediate portion of the GaN electron transit layer 3). Furthermore, the thickness of the AlN spacer layer 4 may be decreased, for example, to 1 nm or less.

In this manner, while the fabrication method according to the embodiment described above includes, before the step of forming the source electrode 7 and the drain electrode 8 but after the step of forming the electron supply layer 5, the step of decreasing the thickness of portion of the electron supply layer 5 under the regions in which the source electrode 7 and the drain electrode 8 are to be formed with respect to the thickness of the other portion, the fabrication method is not limited to this. For example, at the step of forming the electron supply layer 5, the electron supply layer 5 having a thickness of approximately 3 nm or less may be formed in the overall area including portions under the regions in which the source electrode 7 and the drain electrode 8 are to be formed.

Further, while, in the embodiment and the modifications described above, ion implantation of a donor impurity element such as Si into at least portions of the electron transit layer 3 under the source electrode 7 and the drain electrode 8 is performed to provide the high-concentration impurity regions 10 having a concentration of a donor impurity element such as Si higher than that of the other portion of the layer, the provision of the high-concentration impurity regions 10 is not limited to this, and the high-concentration impurity regions 10 may be provided in the following manner. For example, at least part of the electron transit layer 3 (for example, where the spacer layer 4 is provided, part of the spacer layer 4 and the electron transit layer 3) under the regions in which the source electrode 7 and the drain electrode 8 are to be formed are removed by etching, a semiconductor layer (n-type semiconductor layer, for example, an n-type GaN layer) in which a donor impurity element (for example, Si or the like) is doped is grown (re-grown) to the etched portions, and thereby may configure the semiconductor stack structure such that, at portions under the source electrode 7 and the drain electrode 8 other than the electron supply layer 5, the high-concentration impurity regions 10 having a concentration of a donor impurity element higher than that of the other portion is provided.

Second Embodiment

Now, a semiconductor device and a fabrication method therefor and a power supply apparatus according to a second embodiment are described below with reference to FIGS. 11 and 12.

The semiconductor device according to the present embodiment is a semiconductor package including the semiconductor device (InAlN/GaN-HEMT) according to any one of the first embodiment and the modifications described above as a semiconductor chip. It is to be noted that the semiconductor chip is referred to sometimes as HEMT chip or transistor chip.

In the following, the second embodiment is described taking a discrete package as an example.

Figure 11:
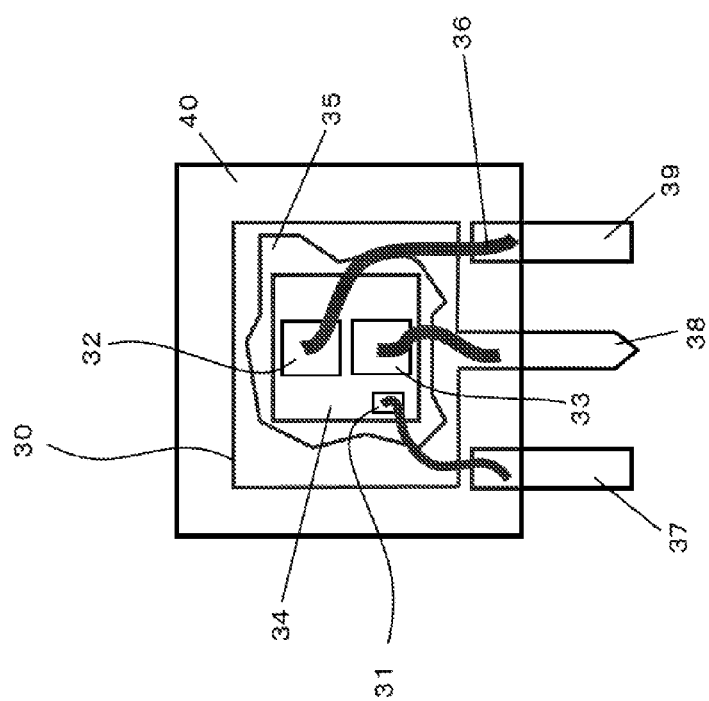
FIG. 11 is a schematic top plan view depicting a configuration of a semiconductor device (semiconductor package) according to a second embodiment.

As depicted in FIG. 11, the present semiconductor device includes a stage 30 on which a semiconductor chip according to one of the first embodiment and the modifications described above therein is mounted, a gate lead 37, a source lead 39, a drain lead 38, bonding wires 36 (here, Al wires) and an encapsulation resin 40. It is to be noted that the encapsulation resin is referred to sometimes as a molding resin.

A gate pad 31, a source pad 32 and a drain pad 33 of the semiconductor chip 34 mounted on the stage 30 are coupled with the gate lead 37, source lead 39 and drain lead 38 by the Al wires 36, respectively, which then undergoes resin encapsulation.

Here, the stage 30 to which the back face of the substrate of the semiconductor chip 34 is fixed by die attach adhesive 35 (here, solder) is electrically coupled with the drain lead 38. It is to be noted that the coupling of the stage 30 is not limited to this, and the stage 30 may be electrically coupled with the source lead 39.

Now, a fabrication method for a semiconductor device (discrete package) according to the present embodiment is described.

First, the semiconductor chip 34 (InAlN/GaN-HEMT) according to one of the first embodiment and the modifications described above is fixed to the stage 30 of a lead frame using, for example, the die attach material 35 (here, solder).

Then, the gate pad 31, drain pad 33 and source pad 32 of the semiconductor chip 34 are coupled with the gate lead 37, drain lead 38 and source lead 39, respectively, by bonding using, for example, the Al wires 36.

Thereafter, resin encapsulation is performed, for example, by a transfer mold method, and then the lead frame is separated.

The semiconductor device (discrete package) can be fabricated in this manner.

It is to be noted here that the present embodiment is described taking, as an example, the discrete package in which the pads 31 to 33 of the semiconductor chip 34 are used as bonding pads for wire bonding, the semiconductor package is not limited to this and a different semiconductor package may be used. For example, a semiconductor package may be used in which pads of a semiconductor chip are used as bonding pads for wireless bonding such as, for example, flip-chip bonding. Further, a wafer level package may be used. Further, a semiconductor package other than a discrete package may be used.

Now, a power supply apparatus in which a semiconductor package including the InAlN/GaN-HEMT described above is provided is described with reference to FIG. 12.

In the following, the power supply apparatus is described below taking, as an example, the case where the InAlN/GaN-HEMT included in the semiconductor package described above is used for a power factor correction (PFC) circuit provided in a power supply apparatus to be used in a server.

Figure 12:
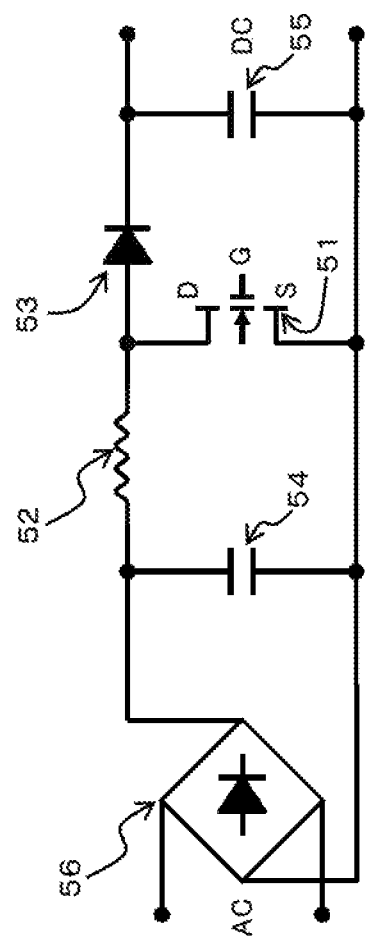
FIG. 12 is a schematic view depicting a configuration of a PFC circuit included in a power supply apparatus according to the second embodiment.

As depicted in FIG. 12, the present PFC circuit includes a diode bridge 56, a choke coil 52, a first capacitor 54, an InAlN/GaN-HEMT 51 included in the semiconductor package described above, a diode 53 and a second capacitor 55.

Here, the present PFC circuit is configured from the diode bridge 56, choke coil 52, first capacitor 54, transistor 51 included in the semiconductor package described above, diode 53 and second capacitor 55 mounted on a circuit board.

In the present embodiment, the drain lead 38, source lead 39 and gate lead 37 of the semiconductor package described above are inserted in a drain lead insertion portion, a source lead insertion portion and a gate lead insertion portion of the circuit board, respectively, and are fixed, for example, by solder or the like. The transistor 51 included in the semiconductor package described above is coupled with the PFC circuit formed on the circuit board in this manner.

In the present PFC circuit, one of terminals of the choke coil 52 and an anode terminal of the diode 53 are coupled with a drain electrode D of the InAlN/GaN-HEMT 51.

Further, one of terminals of the first capacitor 54 is coupled with the other one of the terminals of the choke coil 52, and one of terminals of the second capacitor 55 is coupled with a cathode terminal of the diode 53. Further, the other one of the terminal of the first capacitor 54, a source electrode S of the InAlN/GaN-HEMT 51 and the other one of the terminal of the second capacitor 55 are grounded. Further, a pair of terminals of the diode bridge 56 are coupled with the opposite terminals of the first capacitor 54, and the other pair of terminals of the diode bridge 56 are coupled with input terminals to which an alternating current (AC) voltage is inputted. Further, the opposite terminals of the second capacitor 55 are coupled with output terminals from which a direct current (DC) voltage is outputted. Further, agate driver not depicted is coupled with a gate electrode G of the InAlN/GaN-HEMT 51. Further, in the present PFC circuit, by driving the InAlN/GaN-HEMT 51 by the gate driver, an AC voltage inputted through the input terminals is converted into a DC voltage and then outputted from the output terminals.

Accordingly, with the power supply apparatus according to the present embodiment, there is an advantage that the reliability can be improved. In particular, since the semiconductor chip 34 according to anyone of the first embodiment and the modifications described above is provided, there is an advantage that a power supply apparatus having high reliability can be constructed.

It is to be noted here that, while the present embodiment is described taking, as an example, the case where the semiconductor device (semiconductor package including an InAlN/GaN-HEMT or an InAlN/GaN-HEMT) described above is used for the PFC circuit provided in the power supply apparatus to be used for a server, the semiconductor device is not limited to this. For example, the semiconductor device (semiconductor package including an InAlN/GaN-HEMT or an InAlN/GaN-HEMT) described above may be used for electronic equipment (electron apparatus) such as a computer other than a server. Further, the semiconductor device (semiconductor package) described above may be used for a different circuit (for example, a DC-DC converter or the like) provided in the power supply apparatus.

Third Embodiment

Now, a high-frequency amplifier according to a third embodiment is described with reference to FIG. 13.

The high-frequency amplifier according to the present embodiment is a high-frequency amplifier (high-output power amplifier) including any one of the semiconductor devices according to the first embodiment and the modifications described above.

Figure 13:
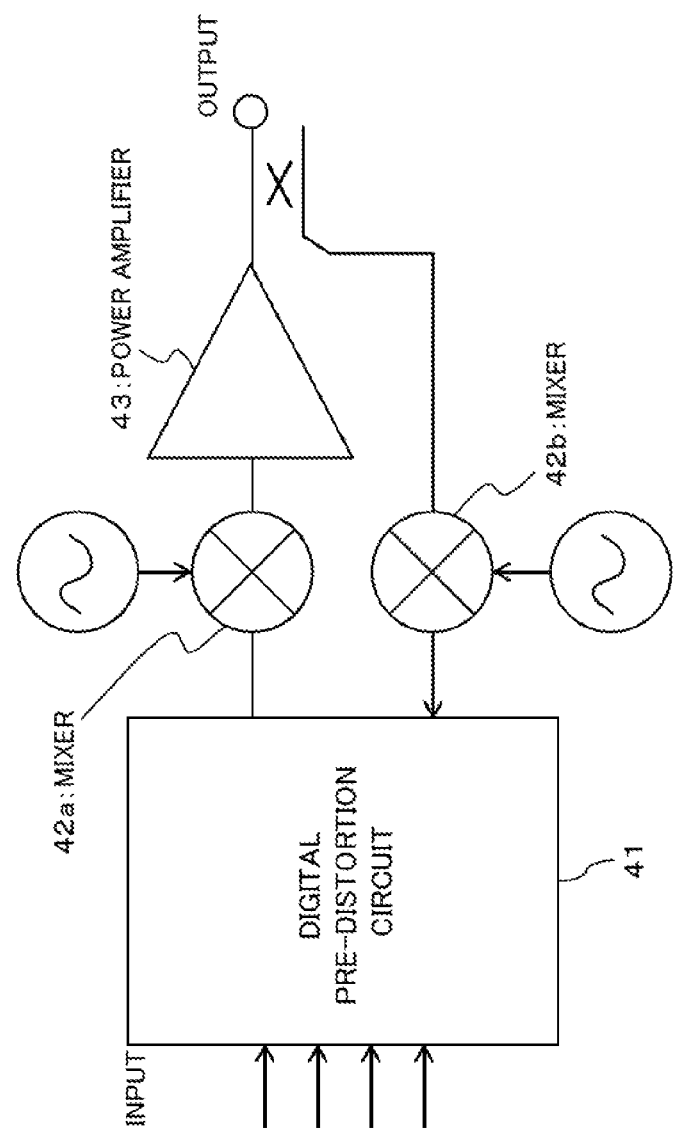
FIG. 13 is a schematic view depicting a configuration of a high-frequency amplifier of a third embodiment.

As depicted in FIG. 13, the present high-frequency amplifier includes a digital pre-distortion circuit 41, mixers 42a and 42b and a power amplifier 43. It is to be noted that the power amplifier is sometimes referred to simply as amplifier.

The digital pre-distortion circuit 41 compensates for non-linear distortion of an input signal.

The mixers 42a and 42b perform mixing of the input signal whose non-linear distortion is compensated for and an alternating current signal.

The power amplifier 43 amplifies the input signal mixed with the alternating current signal and includes a semiconductor chip including any one of the semiconductor devices according to the first embodiment and the modifications described above, namely, a semiconductor chip including an InAlN/GaN-HEMT. It is to be noted that the semiconductor chip is referred to sometimes as HEMT chip or transistor chip.

It is to be noted that a configuration is depicted in FIG. 13 in which, for example, by changeover of a switch, a signal at the output side can be mixed with an alternating current signal by the mixer 42b and sent out to the digital pre-distortion circuit 41.

Accordingly, with the high-frequency amplifier according to the present embodiment, since the semiconductor device according to any one of the first embodiment and the modifications described above is applied to the power amplifier 43, there is an advantage that a high-frequency amplifier having high reliability can be implemented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
 a carrier transit layer including a first region and second and third regions having a density of a donor impurity element higher than that of the first region;
 an $In_XAl_YGa_{(1-X-Y)}N$ ($0<X<1$, $0<Y<1$, $0<X+Y\leq 1$) carrier supply layer provided over the carrier transit layer and a whole of the carrier supply layer having a density of a donor impurity element lower than that of the second and third regions;
 a source electrode provided over the second region;
 a drain electrode provided over the third region; and
 a gate electrode provided over the carrier supply layer between the source electrode and the drain electrode.

2. The semiconductor device according to claim 1, further comprising:
 a spacer layer provided between the carrier transit layer and the carrier supply layer and includes a first region and second and third regions having a density of a donor impurity element higher than that of the first region; wherein
 the source electrode is provided over the second region of the carrier transit layer and the second region of the spacer layer; and
 the drain electrode is provided over the third region of the carrier transit layer and the third region of the spacer layer.

3. The semiconductor device according to claim 1, further comprising a spacer layer provided between the carrier transit layer and the carrier supply layer and having a density of a donor impurity element lower than that of the second and third regions.

4. The semiconductor device according to claim 1, wherein the carrier supply layer includes a first region provided over the first region of the carrier transit layer, a second region provided between the second region of the carrier transit layer and the source electrode and a third region provided between the third region of the carrier transit layer and the drain electrode; wherein the second region and the third region of the carrier supply layer have a thickness smaller than that of the first region of the carrier supply layer.

5. The semiconductor device according to claim 4, wherein the thickness of the second region and the third region of the carrier supply layer is 3 nm or less.

6. The semiconductor device according to claim 1, wherein the carrier supply layer is provided over the first region of the carrier transit layer.

7. The semiconductor device according to claim 1, wherein the carrier supply layer includes a first region provided over the first region of the carrier transit layer, a second region provided between the second region of the carrier transit layer and the source electrode, and a third region provided between the third region of the carrier transit layer and the drain electrode; and the first, second and third regions of the carrier supply layer have a thickness equal to or smaller than 3 nm.

8. The semiconductor device according to claim 1, wherein the donor impurity element is one of Si, O, S, Ge, Te and Se.

9. A power supply apparatus, comprising:
a transistor; wherein
the transistor includes:
a carrier transit layer including a first region and second and third regions having a density of a donor impurity element higher than that of the first region;
an $In_X Al_Y Ga_{(1-X-Y)} N$ ($0<X<1$, $0<Y<1$, $0<X+Y\leq 1$) carrier supply layer provided over the carrier transit layer and a whole of the carrier supply layer having a density of a donor impurity element lower than that of the second and third regions;
a source electrode provided over the second region;
a drain electrode provided over the third region; and
a gate electrode provided over the carrier supply layer between the source electrode and the drain electrode.

10. A high-frequency amplifier, comprising:
an amplifier configured to amplify an input signal; wherein
the amplifier includes a transistor; and
the transistor includes:
a carrier transit layer including a first region and second and third regions having a density of a donor impurity element higher than that of the first region;
an $In_X Al_Y Ga_{(1-X-Y)} N$ ($0<X<1$, $0<Y<1$, $0<X+Y\leq 1$) carrier supply layer provided over the carrier transit layer and a whole of the carrier supply layer having a density of a donor impurity element lower than that of the second and third regions;
a source electrode provided over the second region;
a drain electrode provided over the third region; and
a gate electrode provided over the carrier supply layer between the source electrode and the drain electrode.

11. A fabrication method for a semiconductor device, comprising:
forming a carrier transit layer including a first region and second and third regions having a density of a donor impurity element higher than that of the first region;
forming, over the carrier transit layer, an $In_X Al_Y Ga_{(1-X-Y)} N$ ($0<X<1$, $0<Y<1$, $0<X+Y\leq 1$) carrier supply layer, a whole of the carrier supply layer having a density of a donor impurity element lower than that of the second and third regions;
forming a source electrode over the second region and forming a drain electrode over the third region; and
forming a gate electrode over the carrier supply layer between the source electrode and the drain electrode.

12. The fabrication method for a semiconductor device according to claim 11, wherein the forming a carrier transit layer includes performing ion implantation of the donor impurity element into the second and third regions and performing annealing for activating ions of the donor impurity element after ion implantation.

13. The fabrication method for a semiconductor device according to claim 11, further comprising, before the forming a carrier supply layer, forming, over the carrier transit layer, a spacer layer including a first region and second and third regions having a density of a donor impurity element higher than that of the first region; and the forming a carrier transit layer and the forming a spacer layer include performing ion implantation of the donor impurity element into the second and third regions of the carrier transit layer and the second and third regions of the spacer layer and performing annealing for activating ions of the donor impurity element after ion implantation.

14. The fabrication method for a semiconductor device according to claim 11, further comprising forming a spacer layer over the carrier transit layer before the forming a carrier supply layer; and the forming a carrier transit layer and the forming a spacer layer include performing ion implantation of the donor impurity element into the second and third regions of the carrier transit layer and forming a spacer layer at a temperature at which ions of the donor impurity element after ion implantation are capable of being activated.

15. The fabrication method for a semiconductor device according to claim 11, further comprising, after the forming a carrier supply layer but before the forming a source electrode and a drain electrode, reducing a thickness of a portion of the carrier supply layer provided over the second and third regions of the carrier transit layer with respect to that of the other portion of the carrier supply layer.

16. The fabrication method for a semiconductor device according to claim 11, further comprising, after the forming a carrier supply layer but before the forming a source electrode and a drain electrode, removing a portion of the carrier supply layer provided over the second and third regions of the carrier transit layer.

17. The fabrication method for a semiconductor device according to claim 11, wherein, in the forming a carrier supply layer, the carrier supply layer having a thickness of 3 nm or less is formed over the first, second and third regions of the carrier transit layer.

* * * * *